United States Patent
Ramachandran et al.

(10) Patent No.: US 7,077,980 B2
(45) Date of Patent: Jul. 18, 2006

(54) PHOSPHORS CONTAINING OXIDES OF ALKALINE-EARTH AND GROUP-13 METALS, AND LIGHT SOURCES INCORPORATING THE SAME

(75) Inventors: Gopi Chandran Ramachandran, Bangalore (IN); Mukunda Srinivas Adyam, Bangalore (IN); Shankar Madras Venugopal, Bangalore (IN); Anant Achyut Setlur, Niskayuna, NY (US); Alok Mani Srivastava, Niskayuna, NY (US); Holly Ann Comanzo, Niskayuna, NY (US); Venkatesan Manivannan, Rexford, NY (US); William Winder Beers, Chesterland, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/836,353

(22) Filed: May 3, 2004

(65) Prior Publication Data

US 2005/0242327 A1 Nov. 3, 2005

(51) Int. Cl.
*C09K 11/55* (2006.01)
*C09K 11/62* (2006.01)
*C09K 11/64* (2006.01)
*H01J 29/20* (2006.01)
*H01J 63/04* (2006.01)
*H01J 1/63* (2006.01)
*H01J 6/20* (2006.01)

(52) U.S. Cl. .......... 252/301.4 R; 257/98; 313/467; 313/486; 313/487; 313/503; 313/639

(58) Field of Classification Search .......... None
See application file for complete search history.

(56) References Cited

U.S. PATENT DOCUMENTS

| | | | | |
|---|---|---|---|---|
| 4,216,408 A | * | 8/1980 | Verstegen et al. | 313/468 |
| 5,041,758 A | * | 8/1991 | Huiskes et al. | 313/487 |
| 5,777,350 A | | 7/1998 | Nakamura et al. | |
| 6,210,987 B1 | | 4/2001 | Kurtz et al. | |
| 6,717,353 B1 | * | 4/2004 | Mueller et al. | 313/501 |
| 6,809,471 B1 | * | 10/2004 | Setlur et al. | 313/503 |

FOREIGN PATENT DOCUMENTS

| | | | |
|---|---|---|---|
| EP | 0094132 | | 5/1983 |
| EP | 0622440 | | 2/1994 |
| EP | 1261013 | | 11/1998 |
| EP | 1378555 | | 6/2003 |
| EP | 1378555 | * | 1/2004 |

OTHER PUBLICATIONS

"Phosphor Handbook", Shiego Shionoya et al., (ed), CRC Press, Boca Raton, Florida, pp. 389-432 (1999).

* cited by examiner

*Primary Examiner*—C. Melissa Koslow
(74) *Attorney, Agent, or Firm*—Fletcher Yoder

(57) ABSTRACT

A phosphor comprises europium, at least two alkaline-earth metals, and at least a Group-13 metal. In one embodiment, the phosphor has a formula selected from the group consisting of $Sr_{4-a-z}A_aEu_zD_{12}O_{22}$ and $Sr_{4-a-z}A_aEu_zD_{14}O_{25}$; wherein A is at least an alkaline-earth metal other than strontium; D is an element selected from the group consisting of Group-13 metals, group-3 metals, and rare-earth metals; $0<a<4$; $0.001<z<0.3$; and $4-a-z>0$. The phosphor can be used in light sources and displays.

26 Claims, 22 Drawing Sheets

PHOSPHORS CONTAINING OXIDES OF ALKALINE-EARTH AND GROUP-13 METALS, AND LIGHT SOURCES INCORPORATING THE SAME

BACKGROUND OF THE INVENTION

This invention relates photoluminescent materials (or phosphors) and lighting technology. In particular, this invention relates to phosphors containing oxides of alkaline-earth and Group-13 metals, and to light sources incorporating such phosphors.

A phosphor is a luminescent material that absorbs radiation energy in a portion of the electromagnetic spectrum and emits energy in another portion of the electromagnetic spectrum. Phosphors of one important class are crystalline inorganic compounds of high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert ultraviolet ("UV") radiation emitted by the excited mercury vapor to visible light. Other phosphors are capable of emitting visible light upon being excited by electrons (used in cathode ray tubes) or X rays (for example, scintillators in X-ray detection systems).

Fluorescent lamps having high luminous output and color rendering indices ("CRI"), which are based on mercury discharge and used for illumination, typically include three phosphors that convert UV radiation of the mercury discharge into relatively narrow bands of blue, green, and red visible light, concentrated in the spectral regions where the human eye has the highest sensitivity (450, 540, and 610 nm). These fluorescent lamps are commonly called tricolor lamps. Although a CRI of about 85 would give a normal appearance to most objects, some typical colors will look unnatural under illumination with tricolor lamps. Therefore, for certain applications, a higher CRI is required. Such a higher CRI can be obtained by using a blue light-emitting phosphor with an emission maximum at about 490 nm. A suitable phosphor having this characteristic emission has been $Sr_4Al_{14}O_{25}:Eu^{2+}$. However, there is a continued need for phosphors having efficiency higher than that of $Sr_4Al_{14}O_{25}:Eu^{2+}$ and similar emission maximum. It is also very desirable to use such novel phosphors to produce light sources having high-energy efficiency and high CRIs.

SUMMARY OF THE INVENTION

The present invention provides phosphors that comprise an oxide of at least two alkaline-earth metals and at least a Group-13 metal, which oxide is activated with europium.

According to one aspect of the present invention, the phosphor has a formula of $Sr_{4-a-z}A_aEu_zD_{12}O_{22}$ or $Sr_{4-a-z}A_aEu_zD_{14}O_{25}$; wherein A is at least an alkaline-earth metal other than strontium; D is at least an element selected from the group consisting of Group-13 metals, Group-3 metals, and rare-earth metals other than europium; 0<a<4; 0.001<z<0.3; and 4-a-z>0.

According to another aspect of the present invention, the phosphor has a formula of $Sr_{4-x-y-z}Ba_xCa_yEu_zD_2O_{22}$ or $Sr_{4-x-y-z}Ba_xCa_yEu_zD_{14}O_{25}$; wherein D is at least a Group-13 metal; $0 \leq x$, $y \leq 2$ and at least one of x and y is non-zero; 0.001<z<0.3; and 4-x-y-z>0.

According to another aspect of the present invention, the phosphor has a formula of $Sr_{4-a-z}Mg_aEu_zD_{12}O_{22}$ or $Sr_{4-a-z}Mg_aEu_zD_{14}O_{25}$; wherein D is a combination of at least two elements independently selected from the group consisting of Group-3 metals, Group-13 metals, and rare-earth metals other than europium; 0<a<4; 0.001<z<0.3; and 4-a-z>0.

According to still another aspect of the present invention, said Group-13 metal is selected from the group consisting of aluminum, gallium, indium, and combinations thereof.

According to another aspect, the present invention provides a method for making a phosphor that comprises an oxide of alkaline-earth and Group-13 metals, which oxide is activated with europium. The method comprises: (a) mixing oxygen-containing compounds of: (1) europium; (2) at least two alkaline-earth metals; and (3) at least a Group-13 metal; and (b) firing the mixture in a reducing atmosphere at a temperature in a range from about 1000° C. to about 1400° C. for a time sufficient to convert the mixture to the phosphor.

According to another aspect, a method for making a phosphor comprises: (a) providing a first solution that comprises compounds of: (1) europium; (2) at least two alkaline-earth metals; and (3) at least a Group-13 metal; (b) combining the first solution and a second solution, the second solution comprising at least a compound selected from the group consisting of ammonium hydroxide; hydroxides of at least one element selected from the group consisting of europium, said at least two alkaline-earth metals, and said at least a Group-13 metal; organic esters; organic dicarboxylic acids; and organic amines to produce a precipitate; (c) heating the precipitate in an oxygen-containing atmosphere at a temperature in a range from about 700° C. to about 1300° C. for a time sufficient to convert the precipitate to an oxygen-containing material that comprises europium, said at least two alkaline-earth metals, and said at least a Group-13 metal; and (d) firing said oxygen-containing material in a reducing atmosphere at a temperature in a range from about 1000° C. to about 1400° C. for a time sufficient to convert said oxygen-containing material to the phosphor.

According to still another aspect of the present invention, a method for making a phosphor comprises: (a) providing a first solution that comprises compounds of: (1) europium; and (2) at least two alkaline-earth metals; (b) combining the first solution and a second solution, the second solution comprising at least a compound selected from the group consisting of ammonium hydroxide; hydroxides of at least one element selected from the group consisting of europium, and said at least two alkaline-earth metals; organic dicarboxylic acids; and organic amines to produce a precipitate; (c) heating the precipitate in an oxygen-containing atmosphere at a temperature in a range from about 700° C. to about 1300° C. for a time sufficient to convert the precipitate to an oxygen-containing material that comprises europium, and said at least two alkaline-earth metals; (d) combining said oxygen-containing material with at least an oxygen-containing compound of at least a Group-13 metal to produce a mixture; and (e) firing said mixture in a reducing atmosphere at a temperature in a range from about 1000° C. to about 1400° C. for a time sufficient to convert said mixture to the phosphor.

According to still another aspect, a visible light source comprises: (a) a source of radiation emitting radiation having wavelength in a range from about 250 nm to about 470 nm, preferably from about 250 nm to about 420 nm; and (b)

a phosphor comprising an oxide of: (1) europium; (2) at least two alkaline-earth metals; and (3) at least a Group-13 metal; wherein the phosphor absorbs at least a portion of said radiation and emits visible light.

Other features and advantages of the present invention will be apparent from a perusal of the following detailed description of the invention and the accompanying drawings in which the same numerals refer to like elements.

Figure 1:
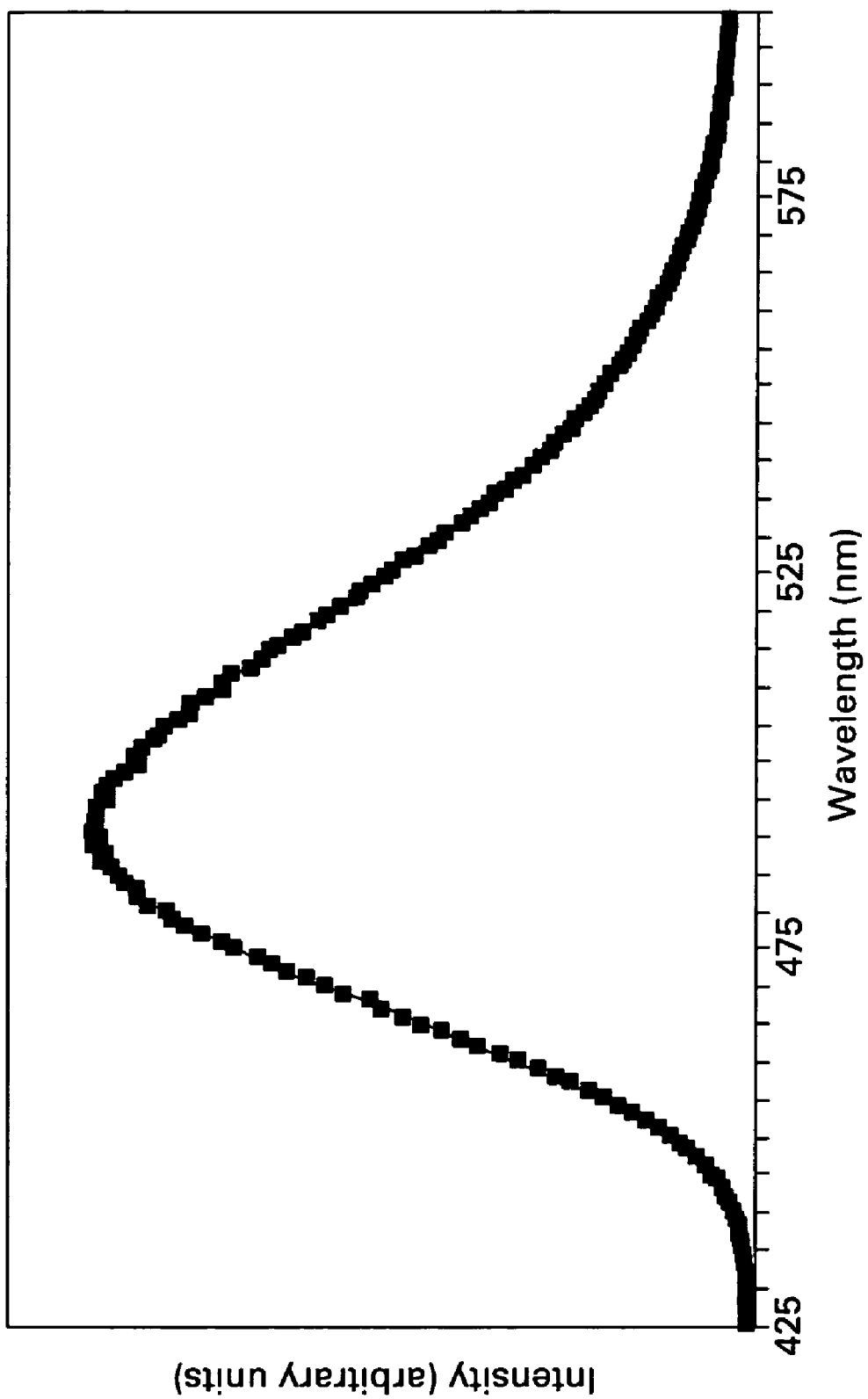
FIG. 1 shows the emission spectrum of the $Sr_{3.8}Ca_{0.1}Eu_{0.1}Al_{12}O_{22}$ phosphor of the present invention.
Figure 2:
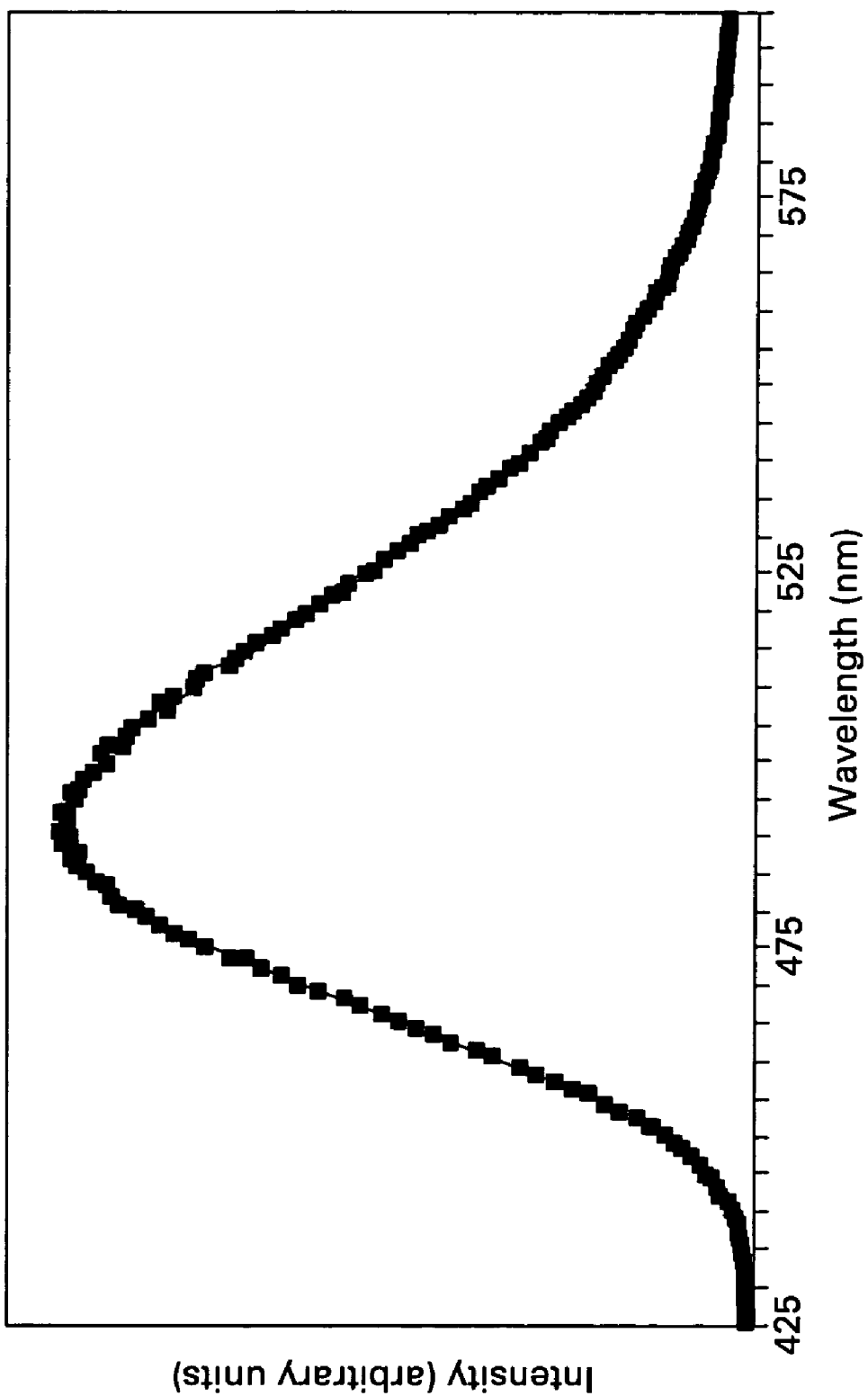
FIG. 2 shows the emission spectrum of the $Sr_{3.5}Ca_{0.4}Eu_{0.1}Al_{12}O_{22}$ phosphor of the present invention.

It should be understood that the drawings are included only for illustration purposes, are not intended to limit the invention in any way, and are not drawn to scale.

DETAILED DESCRIPTION OF THE INVENTION

In general, the present invention provides phosphors that comprise oxide of at least two alkaline-earth metals and at least a Group-13 metal, which oxide is activated with europium. The phosphors of the present invention are excitable by radiation in the having wavelength in the range from about 250 nm to about 420 nm to emit substantially in visible light wavelengths from about 450 nm to about 550 nm.

According to one aspect of the present invention, the phosphor has a formula of $Sr_{4-a-z}A_aEu_zD_{12}O_{22}$ or $Sr_{4-a-z}A_aEu_zD_{14}O_{25}$; wherein A is at least an alkaline-earth metal other than strontium; D is at least a metal selected from the group consisting of aluminum, gallium, indium, and combinations thereof; $0<a<4$; $0.001<z<0.3$; and $4-a-z>0$.

According to another aspect of the present invention, the phosphor has a formula of $Sr_{4-x-y-a}Ba_xCa_yEu_zD_{12}O_{22}$ or $Sr_{4-x-y-z}Ba_xCa_yEu_zD_{14}O_{25}$; wherein D is at least a metal selected from the group consisting of aluminum, gallium, indium, and combinations thereof; $0 \leq x$, $y \leq 2$ and at least one of x and y is non-zero (i.e, if $0 \leq x \leq 2$, then $0<y \leq 2$; and if $0 \leq y \leq 2$, then $0<x \leq 2$); $0.001<z<0.3$; and $4-x-y-z>0$.

In one embodiment, $0 \leq x$, $y \leq 1.5$, and at least one of x and y is non-zero.

In another embodiment, $0 \leq x$, $y \leq 1$, and at least one of x and y is non-zero.

In still another embodiment, $0.001<z<0.2$, preferably $0.005<z<0.2$, and more preferably $0.01<z<0.15$.

In yet another embodiment, D is aluminum.

In yet another embodiment, a portion of the D element is substituted with a Group-3 metal.

According to one aspect of the present invention, the phosphor has a formula selected from the group consisting of $Sr_{3.8}Ca_{0.1}Eu_{0.1}Al_{12}O_{22}$, $Sr_{3.7}Ca_{0.2}Eu_{0.1}Al_{12}O_{22}$, $Sr_{3.5}Ca_{0.4}Eu_{0.1}Al_{12}O_{22}$, $Sr_{3.4}Ca_{0.5}Eu_{0.1}Al_{12}O_{22}$, $Sr_{3.3}Ca_{0.6}Eu_{0.1}Al_{12}O_{22}$, $Sr_{2.9}CaEu_{0.1}Al_{12}O_{22}$, $Sr_{2.4}Ca_{1.5}Eu_{0.1}Al_{12}O_{22}$, $Sr_{3.1}Ba_{0.2}Ca_{0.6}Eu_{0.1}Al_{12}O_{22}$, $Sr_{2.7}Ba_{0.2}CaEu_{0.1}Al_{12}O_{22}$, $Sr_{2.5}Ba_{0.6}Ca_{0.8}Eu_{0.1}Al_{12}O_{22}$, $Sr_{1.9}BaCaEu_{0.1}Al_{12}O_{22}$, $Sr_{3.1}Ba_{0.2}Ca_{0.6}Eu_{0.1}Al_{14}O_{25}$, $Sr_{2.7}Ba_{0.2}CaEu_{0.1}Al_{13}O_{25}$, $Sr_{2.5}Ba_{0.6}Ca_{0.8}Eu_{0.1}Al_{14}O_{25}$, and $Sr_{1.9}BaCaEu_{0.1}Al_{14}O_{25}$.

According to another aspect of the present invention, the phosphor has a formula of $Sr_{4-a-z}Mg_aEu_zD_{12}O_{22}$ or $Sr_{4-a-z}Mg_aEu_zD_{14}O_{25}$; wherein D is a combination of at least two elements independently selected from the group consisting of Group-3 metals, Group-13 metals, and rare-earth metals other than europium; $0<a<4$; $0.001<z<0.3$; and $4-a-z>0$.

According to still another aspect of the present invention, D in the formula of the immediately preceding paragraph is a combination of at least two elements independently selected from the group consisting of Group-3 metals and Group-13 metals.

According to still another aspect of the present invention, said at least a Group-3 metal is selected from the group consisting of scandium, yttrium, lanthanum, and combinations thereof; and said at least a Group-13 metal is selected from the group consisting of aluminum, gallium, indium, and combinations thereof.

According to still another aspect of the present invention, said at least a Group-3 metal is lanthanum; and said at least a Group-13 metal is aluminum.

According to still another aspect of the present invention, the phosphor has a formula selected from the group consisting of $Sr_{2.9}MgEu_{0.1}Al_{11}LaO_{22}$, $Sr_{1.9}Mg_2Eu_{0.1}Al_{10}La_2O_{22}$, $Sr_{0.9}Mg_3Eu_{0.1}Al_9La_3O_{22}$, $Sr_{2.9}MgEu_{0.1}Al_{13}LaO_{25}$, $Sr_{1.9}Mg_2Eu_{0.1}Al_{12}La_2O_{25}$, and $Sr_{0.9}Mg_3Eu_{0.1}Al_{11}La_3O_{25}$.

The present invention also provides methods for making a phosphor that comprises an oxide of: (a) europium; (b) at least two alkaline-earth metals; and (c) at least a Group-13 metal. A phosphor of the present invention can be produced by a dry method or a wet method. The dry method comprises: (a) mixing oxygen-containing compounds of: (1) europium; (2) said at least two alkaline-earth metals; and (3) said at least a Group-13 metal to form a mixture; and (b) firing the mixture in a reducing atmosphere at a temperature in a range from about 1000° C. to about 1400° C. for a time sufficient to convert the mixture to the phosphor.

In one aspect of the present invention, oxygen-containing compounds of at least an element selected from the group consisting of Group-3 metals and rare-earth metals other than europium are included in the mixing step.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired to a temperature in the range from about 1000° C. to about 1400° C. The drying may be carried out at ambient atmosphere or under a vacuum. The firing may be conducted in a batchwise or continuous process, preferably with a stirring or mixing action to promote good gas-solid contact. A firing time in a range from about 1 minute to about 10 hours is adequate. It should be noted that the firing time can depend on the amount of material being treated to produce the phosphor, or on the extent of contact between the solid and the gas of the atmosphere, or on the degree of mixing while the mixture is fired or heated. Preferably, the temperature is in the range from about 1000° C. to about 1400° C.

The mixture can be rapidly brought to and held at the final temperature. Alternatively, the mixture may be heated up to the final temperature at a lower rate, such as from about 10° C./minute to about 200° C./minute, preferably from about 10° C./minute to about 100° C./minute.

A reducing atmosphere suitable for the method of manufacture of the present invention comprises a reducing gas, such as hydrogen, carbon monoxide, ammonia, hydrazine, or a mixture of one of these compounds with an inert gas selected from the group consisting of nitrogen, helium, argon, krypton, xenon, and combinations thereof. A preferred reducing gas is a mixture of hydrogen and nitrogen containing hydrogen in an amount from about 0.5 volume percent to about 10 volume percent. Alternatively, the reducing gas mixture is generated by a reaction between the residual oxygen in the reactor or firing chamber and carbon particles packed therein to scavenge this residual oxygen.

In a preferred embodiment, the mixture of starting materials for producing the phosphor also comprises a flux, such as boric acid, lithium tetraborate, lithium carbonate, hydrogen borate, alkali hydroborate, or a mixture thereof. It may be desirable to wash the product with hot water to remove residual soluble impurities from the flux.

According to another aspect of the present invention, the flux may comprise at least a halide compound of europium, said alkaline-earth metals, or said Group-13 metals (and said Group-3 metals and/or said rare-earth metals other than europium, if part of the Group-13 metal of the phosphor is substituted with a Group-3 metal and or a rare-earth metal other than europium). In one embodiment, the halide compound is a fluoride. The halide compound acts as a flux during the firing step and can comprise up to about 10 percent by weight of the mixture. The flux also can be an alkali halide. When the flux is an alkali halide, it may be desirable to wash the phosphor after firing to remove the residual alkali compound.

The oxygen-containing compounds of europium, said at least two alkaline-earth metals, and said at least a Group-13 metal may be selected from the group consisting of oxides, carbonates, nitrates, sulfates, phosphates, citrates, carboxylates (salts of carboxylic acids), and combinations thereof. Lower carboxylates (e.g., having from one to five carbon atoms, inclusive), such as acetates, may be desirable.

According to another aspect, a method for making a phosphor comprises: (a) providing a first solution that comprises compounds of: (1) europium; (2) at least two alkaline-earth metals; and (3) at least a Group-13 metal; (b) combining the first solution and a second solution, the second solution comprising at least a compound selected from the group consisting of ammonium hydroxide; hydroxides of at least one element selected from the group consisting of europium, said at least two alkaline-earth metals, and said at least a Group-13 metal; organic esters; organic dicarboxylic acids; and organic amines to produce a precipitate; (c) heating the precipitate in an oxygen-containing atmosphere at a temperature in a range from about 700° C. to about 1300° C. for a time sufficient to convert the precipitate to an oxygen-containing material that comprises europium, said at least two alkaline-earth metals, and said at least a Group-13 metal; and (d) firing said oxygen-containing material in a reducing atmosphere at a temperature in a range from about 1000° C. to about 1400° C. for a time sufficient to convert said oxygen-containing material to the phosphor.

In one embodiment, the first solution is simply an aqueous solution if the compounds of europium, said at least two alkaline-earth metals, and said at least a Group-13 metal are readily dissolved in water.

In another embodiment, the first solution also comprises at least a compound of a Group-3 metal or a rare-earth metal other than europium.

In another embodiment, oxides or other oxygen-containing compounds of europium, said at least two alkaline-earth metals, and said at least a Group-13 metal are dissolved in an acidic solution to form the first solution, such as hydrochloric acid, nitric acid, sulfuric acid, citric acid, or acetic acid. The strength of the acid solution is chosen to rapidly dissolve the oxides or the oxygen-containing compounds, and the choice is within the skill of a person skilled in the art. The second solution (e.g., ammonium hydroxide) is then added in increments to the first solution while stirring to precipitate a mixture of oxygen-containing compounds of europium, said at least two alkaline-earth metals, and said at least a Group-13 metal. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. Alternatively, an ester of an organic acid may be used to carry out the precipitation; such as methyl, ethyl, or propyl esters of acetic acid, propionic acid, butyric acid, oxalic acid, malonic acid, succinic acid, or glutaric acid; dimethyl, diethyl, dipropyl esters of oxalic acid, malonic acid, succinic acid, or glutaric acid. Alternatively, an organic acid selected from the group consisting of oxalic acid, malonic acid, succinic acid, and glutaric acid, may be used to produce the precipitate. The precipitate is filtered, washed with deionized water, and optionally dried. The dried precipitate is ball milled or otherwise thoroughly blended and then fired in said reducing atmosphere at a temperature in the range from about 1000° C. to about 1400° C., preferably from about 1200° C. to about 1400° C. Alternatively, the wet precipitate can be heated or fired first, and then ball milled or otherwise thoroughly blended afterward.

In one embodiment of the method of the present invention a flux is included in the first solution. A flux is selected from the group disclosed above in conjunction with the dry method.

The oxygen-containing atmosphere for the heating step (c) can be air; oxygen; a mixture of oxygen and an inert gas selected from the group consisting of nitrogen, helium, argon, krypton, xenon, and combinations thereof; $NO_x$; or $SO_x$. The oxygen-containing atmosphere can comprise a gas that decomposes to give an oxygen-containing compound at the heating temperature. The heating time for step (c) is in the range from about 1 minute to about 10 hours.

A reducing atmosphere suitable for the method of manufacture of the present invention comprises a reducing gas selected from the group consisting of hydrogen, carbon monoxide, ammonia, hydrazine, and mixtures of one of these compounds with an inert gas selected from the group consisting of nitrogen, helium, argon, krypton, xenon, and combinations thereof. A preferred reducing gas is a mixture of hydrogen and nitrogen containing hydrogen in an amount from about 0.5 volume percent to about 10 volume percent. A firing time in a range from about 1 minute to about 10 hours is adequate. It should be noted that the firing time can depend on the amount of material being treated to produce the phosphor, or on the extent of contact between the solid and the gas of the atmosphere, or on the degree of mixing while the mixture is fired.

According still another aspect of the present invention, a method for making a phosphor comprise: (a) providing a first solution that comprises at least one compound of at least one of phosphor elements selected from the group consisting of europium, at least two alkaline-earth metals, and at least a Group-13 metal; (b) combining the first solution with a second solution, the second solution comprising hydroxides of phosphor elements that are absent in the first solution to form a precipitate; (c) heating the precipitate in an oxygen-containing atmosphere at a temperature in a range from about 700° C. to about 1300° C. for a time sufficient to convert the precipitate to an oxygen-containing material that comprises europium, said at least two alkaline-earth metals, and said at least a Group-13 metal; and (d) firing said mixture in a reducing atmosphere at a temperature in a range from about 1000° C. to about 1400° C. for a time sufficient to convert said mixture to the phosphor.

According to still another aspect of the present invention, a method for making a phosphor comprises: (a) providing a first solution that comprises compounds of: (1) at least two alkaline-earth metals; and (2) europium; (b) combining the first solution and a second solution, the second solution comprising at least a compound selected from the group consisting of ammonium hydroxide; hydroxides of at least one element selected from the group consisting of europium and said at least two alkaline-earth metals; organic esters; organic dicarboxylic acids; and organic amines to produce a precipitate; (c) heating the precipitate in an oxygen-containing atmosphere at a temperature in a range from about 700° C. to about 1300° C. for a time sufficient to convert the precipitate to an oxygen-containing material that comprises europium and said at least two alkaline-earth metals; (d) combining said oxygen-containing material with at least an oxygen-containing compound of at least a Group-13 metal (and optionally also at least an oxygen-containing compound of at least a Group-3 metal and/or at least an oxygen-containing compound of at least a rare-earth metal other than europium) to form a mixture; and (e) firing said mixture in a reducing atmosphere at a temperature in a range from about 1000° C. to about 1400° C. for a time sufficient to convert said oxygen-containing material to the phosphor.

In one embodiment, the first solution is simply an aqueous solution if the compounds of europium and said at least two rare-earth metals are readily dissolved in water.

In another embodiment, oxides or other oxygen-containing compounds of europium and said at least two rare-earth metals are dissolved in an acidic solution to form the first solution, such as hydrochloric acid, nitric acid, sulfuric acid, citric acid, or acetic acid. The strength of the acid solution is chosen to rapidly dissolve the oxides or the oxygen-containing compounds, and the choice is within the skill of a person skilled in the art. The second solution (e.g., ammonium hydroxide) is then added in increments to the first solution while stirring to precipitate a mixture of oxygen-containing compounds of europium and said at least two rare-earth metals. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. Alternatively, an ester of an organic acid may be used to carry out the precipitation; such as methyl, ethyl, or propyl esters of acetic acid, propionic acid, butyric acid, oxalic acid, malonic acid, succinic acid, or glutaric acid; dimethyl, diethyl, dipropyl esters of oxalic acid, malonic acid, succinic acid, or glutaric acid. Alternatively, an organic acid selected from the group consisting of oxalic acid, malonic acid, succinic acid, and glutaric acid, may be used in the second solution to produce the precipitate. The precipitate is filtered, washed with deionized water, and optionally dried. The dried precipitate may be ball milled or otherwise thoroughly blended before being combined with an oxygen-containing compound of at least a Group-13 metal, and then fired in said reducing atmosphere at a temperature in the range from about 1000° C. to about 1400° C., preferably from about 1200° C. to about 1400° C.

In one embodiment of the method of the present invention a flux is included in the first solution. A flux is selected from the group disclosed above in conjunction with the dry method.

EXAMPLE 1

Manufacture of the Phosphor $Sr_{3.9}Eu_{0.1}Al_{12}O_{22}$

The following quantities of materials were blended thoroughly together in a roller mill for 4 hours, using ¼-inch and ½-inch balls of yttria-partially-stabilized zirconia to form a mixture:

| | |
|---|---|
| $SrCO_3$: | 6.909 g |
| $Eu_2O_3$: | 0.211 g |
| $Al_2O_3$: | 7.339 g |
| $H_3BO_3$ (as a flux): | 0.742 g |

The mixture was heated up to 1300° C. at a rate of 180° C./hour and fired in a reducing atmosphere of 1 percent (by volume) hydrogen in nitrogen at 1300° C., for 5 hours. The material was then cooled down to room temperature at a rate of 180° C./hour in the same reducing atmosphere. The material was then washed with hot water to remove boric acid therefrom, milled to a size of about 13 micrometers on a rack mill, and dried to yield the phosphor having a formula of $Sr_{3.9}Eu_{0.1}Al_{12}O_{22}$.

EXAMPLE 2

Manufacture of the Phosphor $Sr_{3.8}Ca_{0.1}Eu_{0.1}Al_{12}O_{22}$

The procedure for manufacturing this phosphor is identical to that described in Example 1 except the following amounts of materials were used:

| | |
|---|---|
| $SrCO_3$: | 6.732 g |
| $Eu_2O_3$: | 0.211 g |
| $Al_2O_3$: | 7.339 g |
| $CaCO_3$: | 0.12 g |
| $H_3BO_3$ (as a flux): | 0.742 g |

EXAMPLE 3

Manufacture of the Phosphor $Sr_{3.7}Ca_{0.2}Eu_{0.1}Al_{12}O_{22}$

The procedure for manufacturing this phosphor is identical to that described in Example 1 except the following amounts of materials were used:

| | |
|---|---|
| $SrCO_3$: | 6.555 g |
| $Eu_2O_3$: | 0.211 g |
| $Al_2O_3$: | 7.339 g |
| $CaCO_3$: | 0.24 g |
| $H_3BO_3$ (as a flux): | 0.742 g |

EXAMPLE 4

Manufacture of the Phosphor $Sr_{3.5}Ca_{0.4}Eu_{0.1}Al_{12}O_{22}$

The procedure for manufacturing this phosphor is identical to that described in Example 1 except the following amounts of materials were used:

| | |
|---|---|
| $SrCO_3$: | 6.2 g |
| $Eu_2O_3$: | 0.211 g |
| $Al_2O_3$: | 7.339 g |
| $CaCO_3$: | 0.48 g |
| $H_3BO_3$ (as a flux): | 0.742 g |

EXAMPLE 5

Manufacture of the Phosphor $Sr_{3.4}Ca_{0.5}Eu_{0.1}Al_{12}O_{22}$

The procedure for manufacturing this phosphor is identical to that described in Example 1 except the following amounts of materials were used:

| | |
|---|---|
| $SrCO_3$: | 6.023 g |
| $Eu_2O_3$: | 0.211 g |
| $Al_2O_3$: | 7.339 g |
| $CaCO_3$: | 0.6 g |
| $H_3BO_3$ (as a flux): | 0.742 g |

EXAMPLE 6

Manufacture of the Phosphor $Sr_{3.3}Ca_{0.6}Eu_{0.1}Al_{12}O_{22}$

The procedure for manufacturing this phosphor is identical to that described in Example 1 except the following amounts of materials were used:

| | |
|---|---|
| $SrCO_3$: | 5.846 g |
| $Eu_2O_3$: | 0.211 g |
| $Al_2O_3$: | 7.339 g |
| $CaCO_3$: | 0.721 g |
| $H_3BO_3$ (as a flux): | 0.742 g |

EXAMPLE 7

Manufacture of the Phosphor $Sr_{2.9}LaEu_{0.1}Al_{11}MgO_{22}$

The procedure for manufacturing this phosphor is identical to that described in Example 1 except the following amounts of materials were used:

| | |
|---|---|
| $SrCO_3$: | 4.281 g |
| $Eu_2O_3$: | 0.176 g |
| $Al_2O_3$: | 5.606 g |
| MgO: | 0.403 g |
| $La_2O_3$: | 1.629 g |
| $H_3BO_3$ (as a flux): | 0.618 g |

EXAMPLE 8

Manufacture of the Phosphor $Sr_{1.9}La_2Eu_{0.1}Al_{10}Mg_2O_{22}$

The procedure for manufacturing this phosphor is identical to that described in Example 1 except the following amounts of materials were used:

| | |
|---|---|
| $SrCO_3$: | 2.805 g |
| $Eu_2O_3$: | 0.176 g |
| $Al_2O_3$: | 5.097 g |
| MgO: | 0.403 g |
| $La_2O_3$: | 3.258 g |
| $H_3BO_3$ (as a flux): | 0.618 g |

EXAMPLE 9

Manufacture of the Phosphor
$Sr_{0.9}La_3Eu_{0.1}Al_9Mg_3O_{22}$

The procedure for manufacturing this phosphor is identical to that described in Example 1 except the following amounts of materials were used:

| | |
|---|---|
| $SrCO_3$: | 1.329 g |
| $Eu_2O_3$: | 0.176 g |
| $Al_2O_3$: | 4.587 g |
| MgO: | 1.209 g |
| $La_2O_3$: | 4.887 g |
| $H_3BO_3$ (as a flux): | 0.618 g |

EXAMPLE 10

Manufacture of the Phosphor
$Sr_{2.9}LaEu_{0.1}Al_{13}MgO_{25}$

The procedure for manufacturing this phosphor is identical to that described in Example 1 except the following amounts of materials were used:

| | |
|---|---|
| $SrCO_3$: | 4.281 g |
| $Eu_2O_3$: | 0.176 g |
| $Al_2O_3$: | 6.626 g |
| MgO: | 0.403 g |
| $La_2O_3$: | 1.629 g |
| $H_3BO_3$ (as a flux): | 0.618 g |

EXAMPLE 11

Manufacture of the Phosphor
$Sr_{1.9}La_2Eu_{0.1}Al_{12}Mg_2O_{25}$

The procedure for manufacturing this phosphor is identical to that described in Example 1 except the following amounts of materials were used:

| | |
|---|---|
| $SrCO_3$: | 2.805 g |
| $Eu_2O_3$: | 0.176 g |
| $Al_2O_3$: | 6.116 g |
| MgO: | 0.806 g |
| $La_2O_3$: | 3.258 g |
| $H_3BO_3$ (as a flux): | 0.618 g |

EXAMPLE 12

Manufacture of the Phosphor
$Sr_{0.9}La_3Eu_{0.1}Al_{11}Mg_3O_{25}$

The procedure for manufacturing this phosphor is identical to that described in Example 1 except the following amounts of materials were used:

| | |
|---|---|
| $SrCO_3$: | 1.329 g |
| $Eu_2O_3$: | 0.176 g |
| $Al_2O_3$: | 5.606 g |
| MgO: | 1.209 g |
| $La_2O_3$: | 4.887 g |
| $H_3BO_3$ (as a flux): | 0.618 g |

Other phosphors of the present invention can be prepared by the same dry method or by the wet method disclosed above.

Non-limiting embodiments of phosphors of the present invention and their quantum efficiency ("QE") are shown in Table 1. The values of QEs reported in Table 1 are relative values compared to a standard commercial blue-green phosphor having a formula of $Sr_4Al_{14}O_{25}:Eu^{2+}$ (QE value of 100).

TABLE 1

| Phosphor Formula | QE at 254 nm excitation | QE at 405 nm excitation |
|---|---|---|
| $Sr_{3.8}Ca_{0.1}Eu_{0.1}Al_{12}O_{22}$ | 103 | 107 |
| $Sr_{3.7}Ca_{0.2}Eu_{0.1}Al_{12}O_{22}$, | 98.8 | No data |
| $Sr_{3.5}Ca_{0.4}Eu_{0.1}Al_{12}O_{22}$ | 107 | 105 |
| $Sr_{3.4}Ca_{0.5}Eu_{0.1}Al_{12}O_{22}$ | 111 | 104 |
| $Sr_{3.3}Ca_{0.6}Eu_{0.1}Al_{12}O_{22}$ | 118 | 112 |
| $Sr_{2.9}CaEu_{0.1}Al_{12}O_{22}$ | 106 | No data |
| $Sr_{2.4}Ca_{1.5}Eu_{0.1}Al_{12}O_{22}$ | 82 | No data |
| $Sr_{3.1}Ba_{0.2}Ca_{0.6}Eu_{0.1}Al_{12}O_{22}$ | 114 | 108 |
| $Sr_{2.7}Ba_{0.2}CaEu_{0.1}Al_{12}O_{22}$ | 99 | 117 |
| $Sr_{2.5}Ba_{0.6}Ca_{0.8}Eu_{0.1}Al_{12}O_{22}$ | 119 | 108 |
| $Sr_{1.9}BaCaEu_{0.1}Al_{12}O_{22}$ | 97 | No data |
| $Sr_{3.8}Ca_{0.1}Eu_{0.1}Al_{14}O_{25}$ | No data | 105 |
| $Sr_{3.5}Ca_{0.4}Eu_{0.1}Al_{14}O_{25}$ | No data | 117 |
| $Sr_{3.1}Ba_{0.2}Ca_{0.6}Eu_{0.1}Al_{14}O_{25}$ | 108 | No data |
| $Sr_{2.7}Ba_{0.2}CaEu_{0.1}Al_{14}O_{25}$ | 70 | No data |
| $Sr_{2.5}Ba_{0.6}Ca_{0.8}Eu_{0.1}Al_{14}O_{25}$ | 106 | 108 |
| $Sr_{1.9}BaCaEu_{0.1}Al_{14}O_{25}$ | 102 | No data |

In addition, a portion of the Group-13 metal may be desirably substituted with at least one Group-3 metal. For example, gadolinium can be partially substituted with at least an element selected from the group consisting of Sc, Y, La, and combinations thereof.

A phosphor of the present invention can be blended with other phosphors that emit blue, green, and red light to provide white light for a light source having a high CRI. For example, a phosphor of the present invention can be combined with a red light-emitting phosphor; a red light-emitting phosphor and a blue light-emitting phosphor; or a red light-emitting phosphor, a blue light-emitting phosphor, and a green light-emitting phosphor. For example, the following blends can give CRI>85: (a) $(Ba,Sr,Ca)MgAl_{10}O_{17}:Eu^{2+}$; $Y_2O_3:Eu^{3+}$; $LaPO_4:Ce^{3+},Tb^{3+}$, and $Sr_4Al_{14}O_{25}:Eu^{2+}$; (b) $(Ba,Sr,Ca)MgAl_{10}O_{17}:Eu^{2+}$, $LaPO_4:Ce^{3+},Tb^{3+}$, $Sr_4Al_{14}O_{25}:Eu^{2+}$; and $YBO_3:Eu^{3+}$; (c) $BaMgAl_{10}O_{17}:Eu^{2+},Mn^{2+}$; $Zn_2SiO_4:Ge^{4+},Mn^{2+}$; and $Y_2O_3:Eu^{3+}$; and (d) $BaMgAl_{10}O_{17}:Eu^{2+},Mn^{2+}$; $Zn_2SiO_4:Ge^{4+},Mn^{2+}$; $Y_2O_3:Eu^{3+}$; and $Sr_4Al_{14}O_{25}:Eu^{2+}$.

White Light-Emitting Device

Incorporation of a blend of phosphors that comprises a blue-green light-emitting phosphor of the present invention (as has been disclosed herein above), a red light-emitting phosphor, and a blue light-emitting phosphor in a mercury discharge device provides a white light-emitting device that have a higher efficiency than prior-art devices.

Another green light-emitting phosphor may be used in addition to a phosphor of the present invention, if desired. Non-limiting examples of such other green light-emitting phosphors are $GdMgB_5O_{10}:Ce^{3+},Tb^{3+}$; $CeMgAl_{11}O_{19}:Ce^{3+}$, $Tb^{3+}$; $Ca_5(PO_4)_3(Cl,F,OH):Sb^{3+},Mn^{2+},Eu^{2+}$; $Sr_4Al_{14}O_{25}:Eu^{2+}$; and $BaAl_8O_{13}:Eu^{2+}$; and combinations thereof.

Non-limiting examples of blue light-emitting phosphors are $(Ba,Sr,Ca)_5(PO_4)_3(Cl,F,OH):Eu^{2+}$; $(Ba,Sr,Ca)MgAl_{10}O_{17}:Eu^{2+}$; $(Ba,Sr,Ca)BPO_5:Eu^{2+}$; and combinations thereof.

Non-limiting examples of other blue-green light-emitting phosphors are $BaAl_8O_{13}:Eu^{2+}$; $2SrO.0.84P_2O_5.0.16B_2O_3:Eu^{2+}$; $MgWO_4$; $BaTiP_2O_8$; $(Ba,Sr,Ca)MgAl_{10}O_{17}:Eu^{2+},Mn^{2+}$; $(Ba,Sr,Ca)_5(PO_4)_3(Cl,F,OH):Sb^{3+}$.

Non-limiting examples of red light-emitting phosphors are $(Y,Gd,La,Lu,Sc)_2O_3:Eu^{3+}$; $(Y,Gd,La,In,Lu,Sc)BO_3:Eu^{3+}$; $(Y,Gd,La)(Al,Ga)O_3:Eu^{3+}$; $(Ba,Sr,Ca)(Y,Gd,La,Lu)_2O_4:Eu^{3+}$; $(Y,Gd)Al_3B_4O_{12}:Eu^{3+}$; monoclinic $Gd_2O_3:Eu^{3+}$; $(Gd,Y)_4(Al,Ga)_2O_9:Eu^{3+}$; $(Ca,Sr)(Gd,Y)_3(Ge,Si)AlO_9:Eu^{3+}$; $(Sr,Mg)_3(PO_4)_2:Sn^{2+}$; $GdMgB_5O_{10}:Ce^{3+},Mn^{2+}$; and $3.5MgO.0.5MgF_2.GeO_2:Mn^{4+}$.

Green light-emitting phosphors used in a phosphor blend of the present invention preferably emit light having a peak emission in the range from about 530 nm to about 550 nm, to which the human eye is most sensitive. Blue light-emitting phosphors used in a phosphor blend of the present invention preferably emit light having a peak emission in the range from about 420 nm to about 500 nm. Red light-emitting phosphors preferably emit light having a peak emission in the wavelength range from about 600 nm to about 620 nm.

Figure 3:
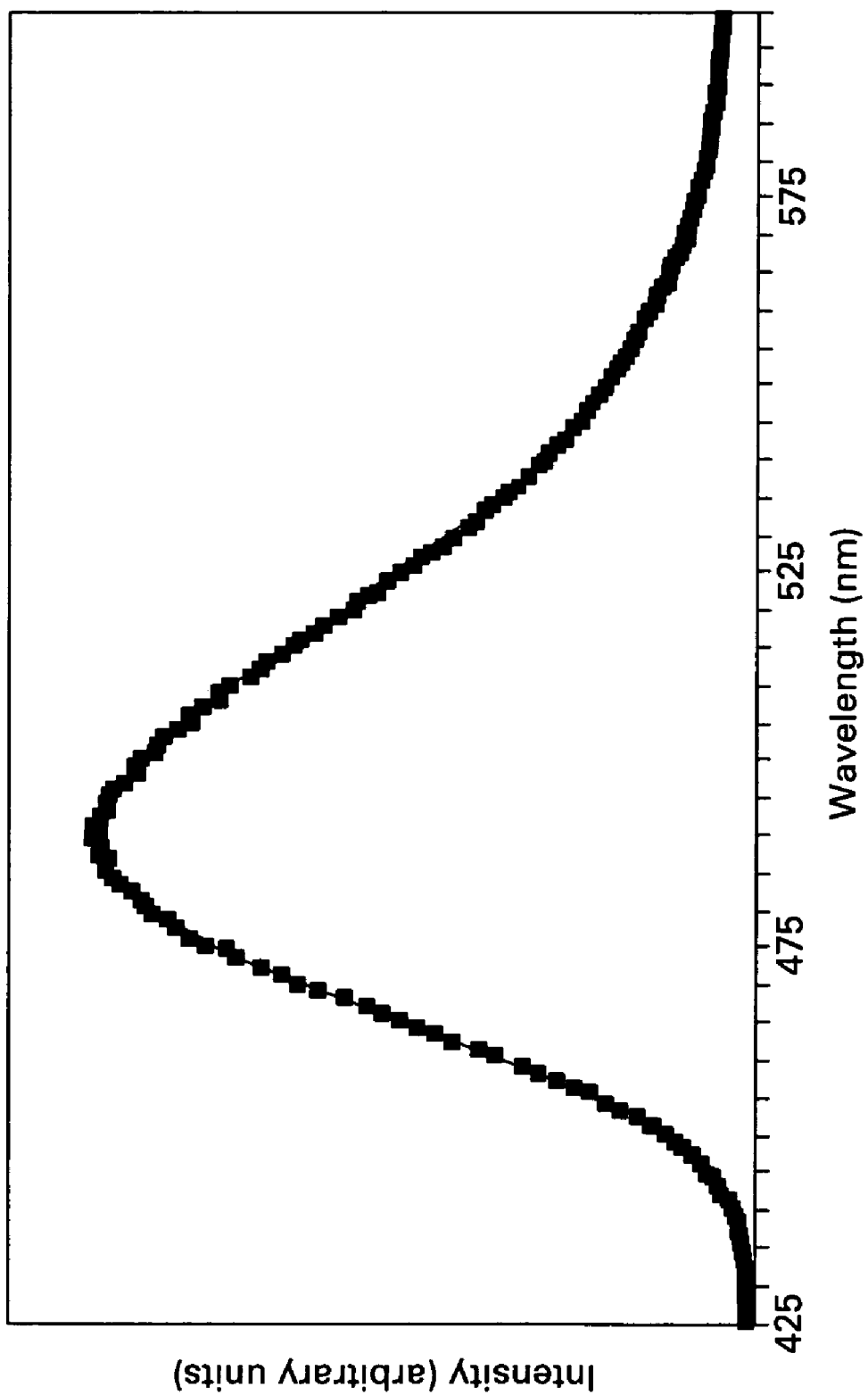
FIG. 3 shows the emission spectrum of the $Sr_{3.5}Ca_{0.4}Eu_{0.1}Al_{12}O_{22}$ phosphor of the present invention.
Figure 4:
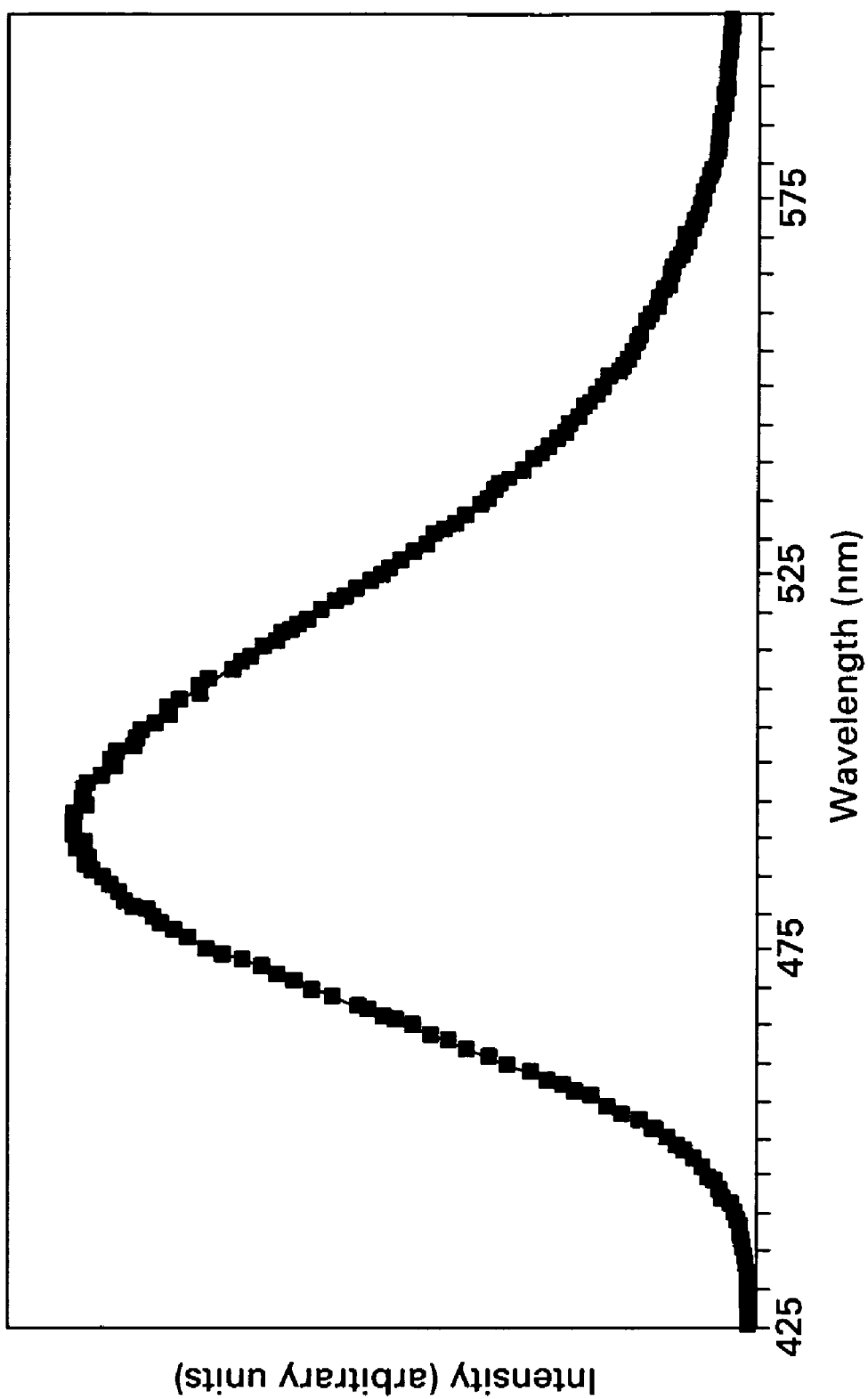
FIG. 4 shows the emission spectrum of the $Sr_{3.3}Ca_{0.6}Eu_{0.1}Al_{12}O_{12}$ phosphor of the present invention.
Figure 5:
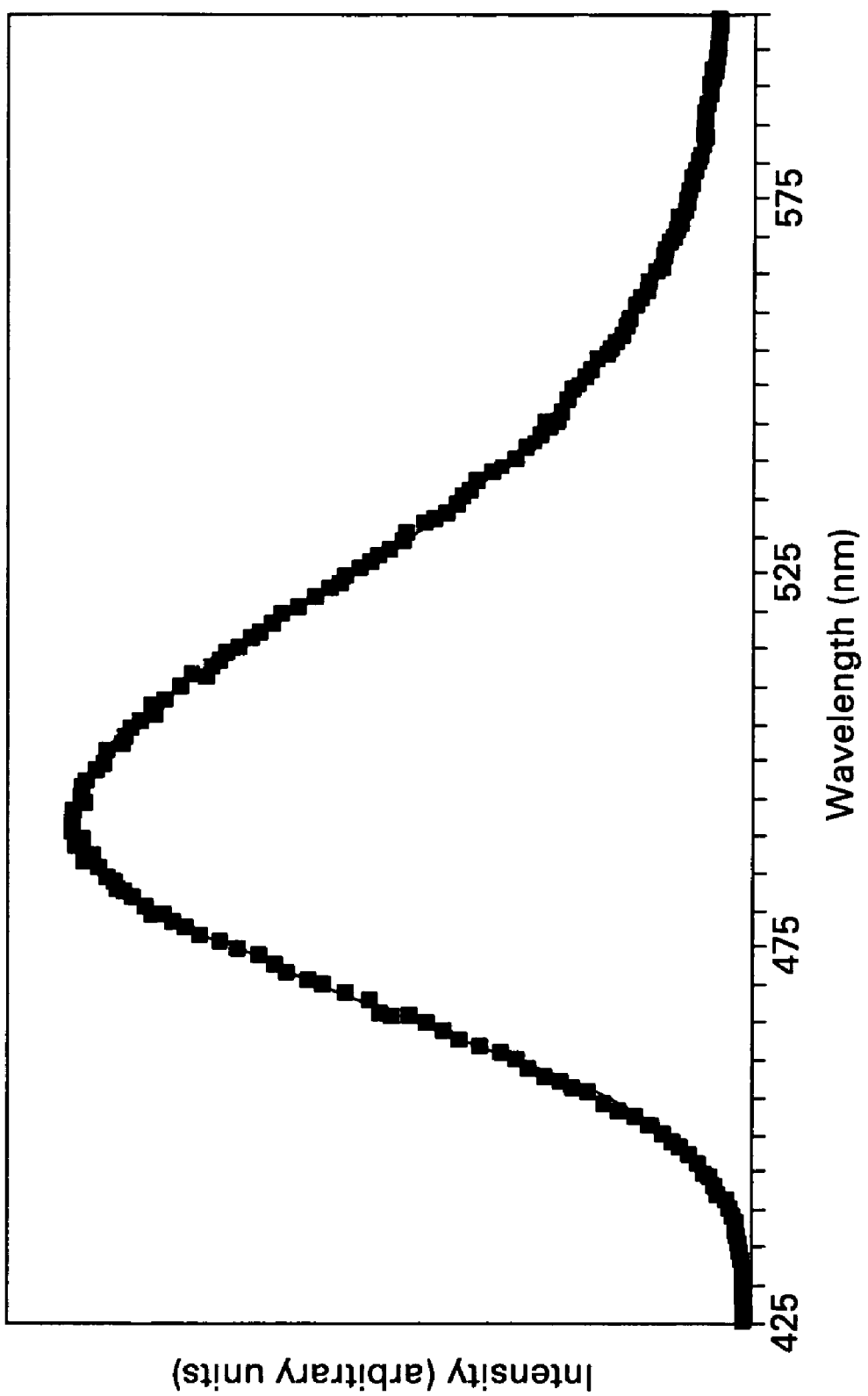
FIG. 5 shows the emission spectrum of the $Sr_{3.1}Ba_{0.2}Ca_{0.6}Eu_{0.1}Al_{12}O_{22}$ phosphor of the present invention.
Figure 6:
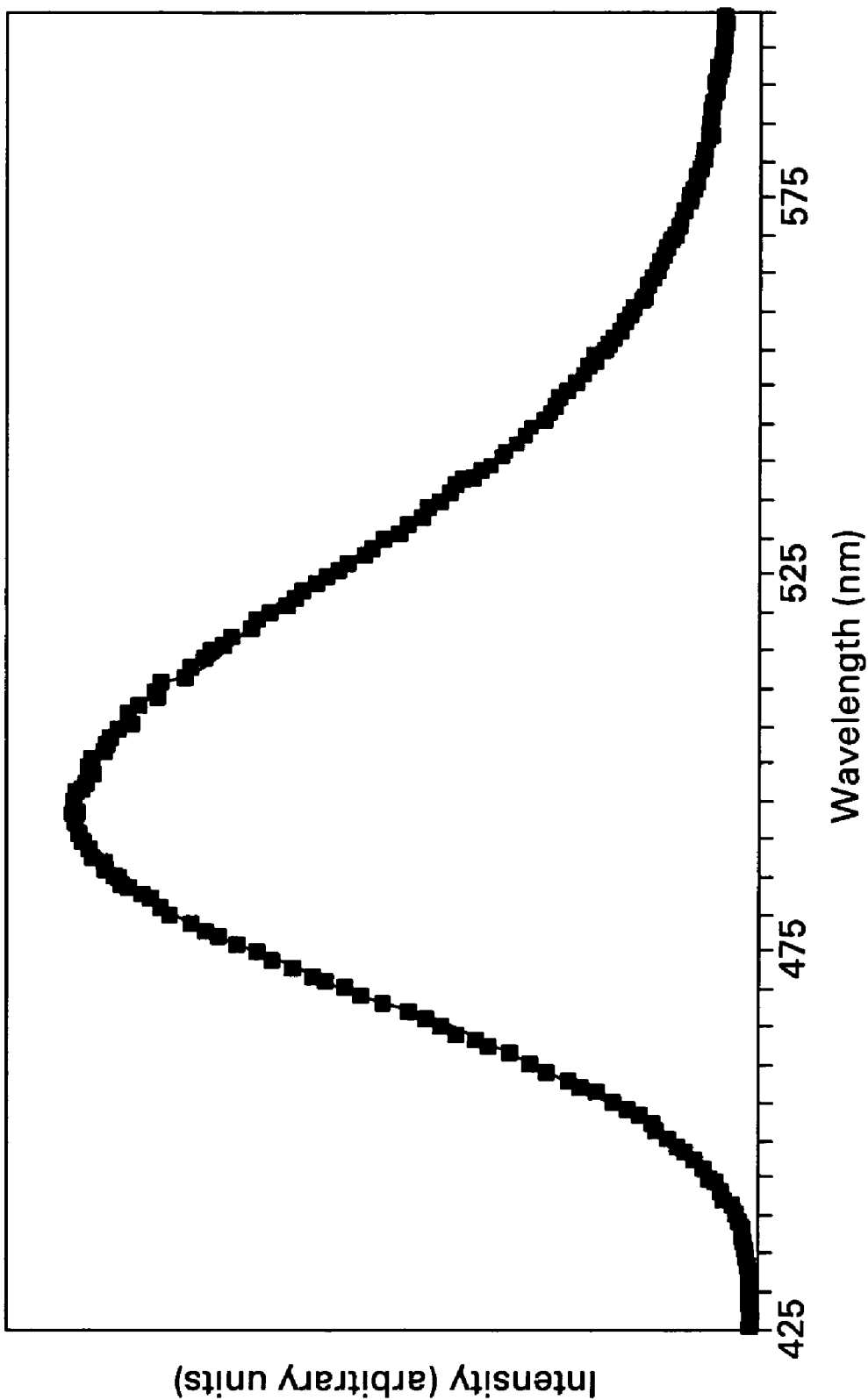
FIG. 6 shows the emission spectrum of the $Sr_{2.5}Ba_{0.6}Ca_{0.8}Eu_{0.1}Al_{12}O_{22}$ phosphor of the present invention.
Figure 7:
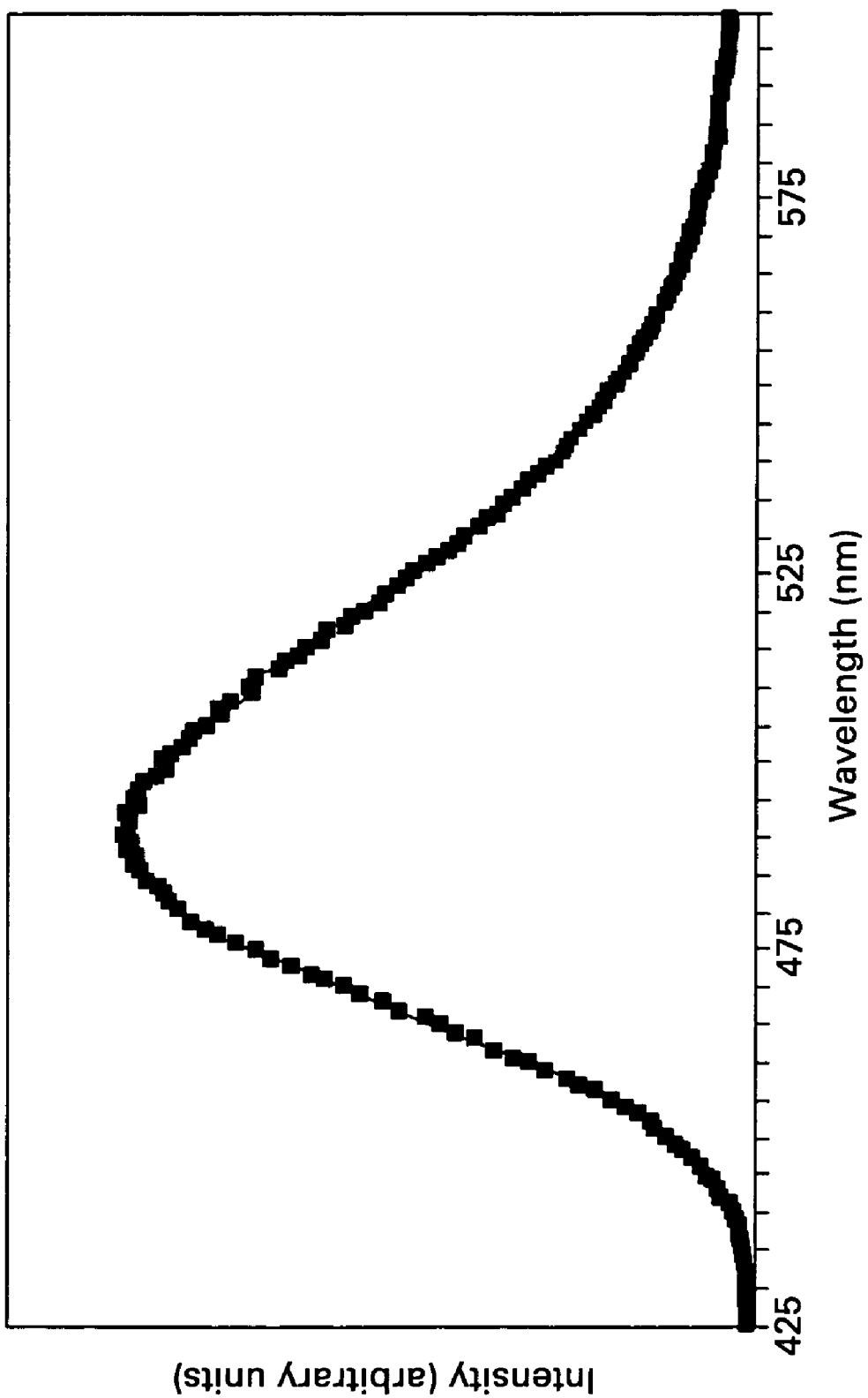
FIG. 7 shows the emission spectrum of the $Sr_{3.8}Ca_{0.1}Eu_{0.1}Al_{14}O_{25}$ phosphor of the present invention.
Figure 8:
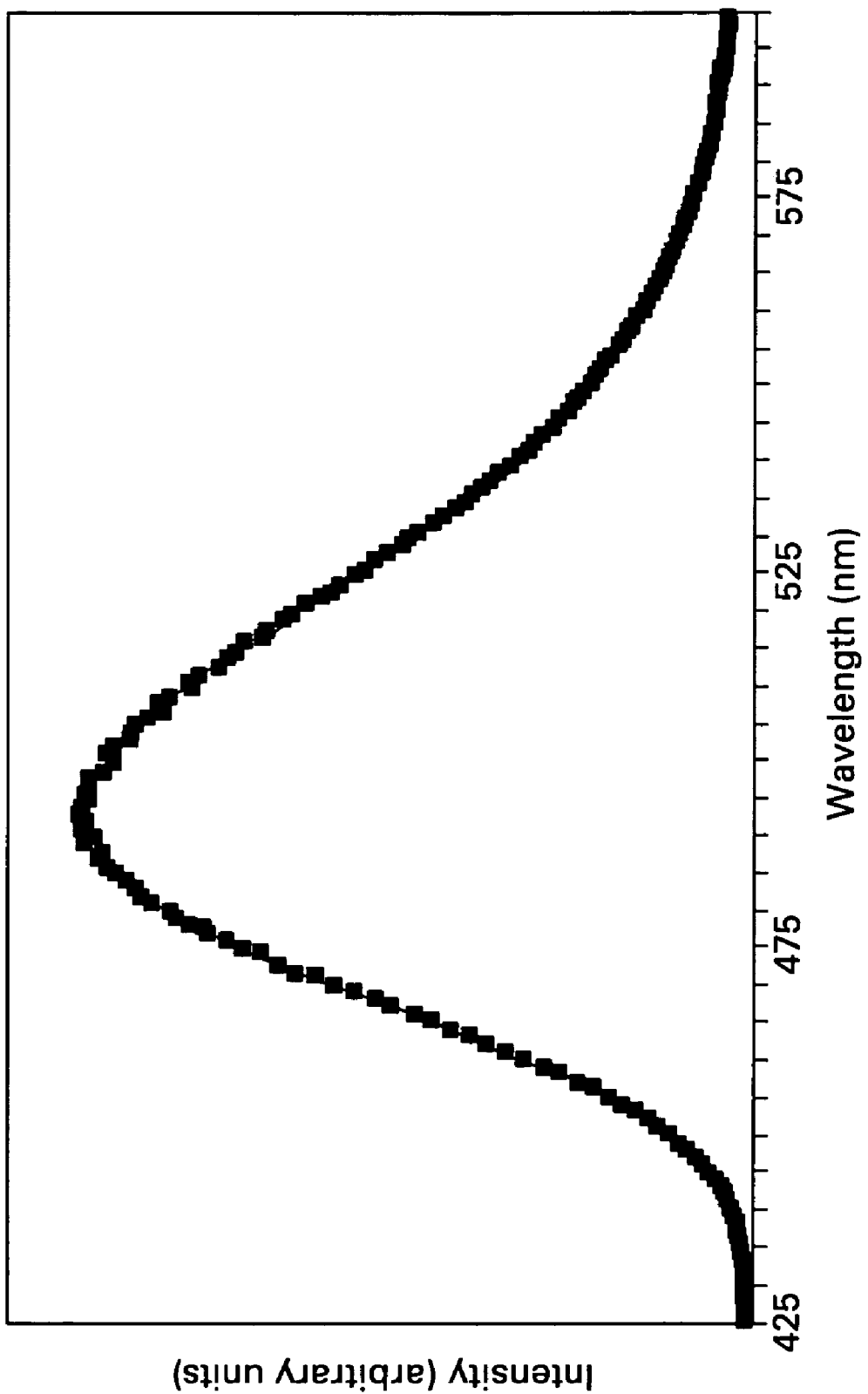
FIG. 8 shows the emission spectrum of the $Sr_{3.1}Ba_{0.2}Ca_{0.6}Eu_{0.1}Al_{14}O_{25}$ phosphor of the present invention.
Figure 9:
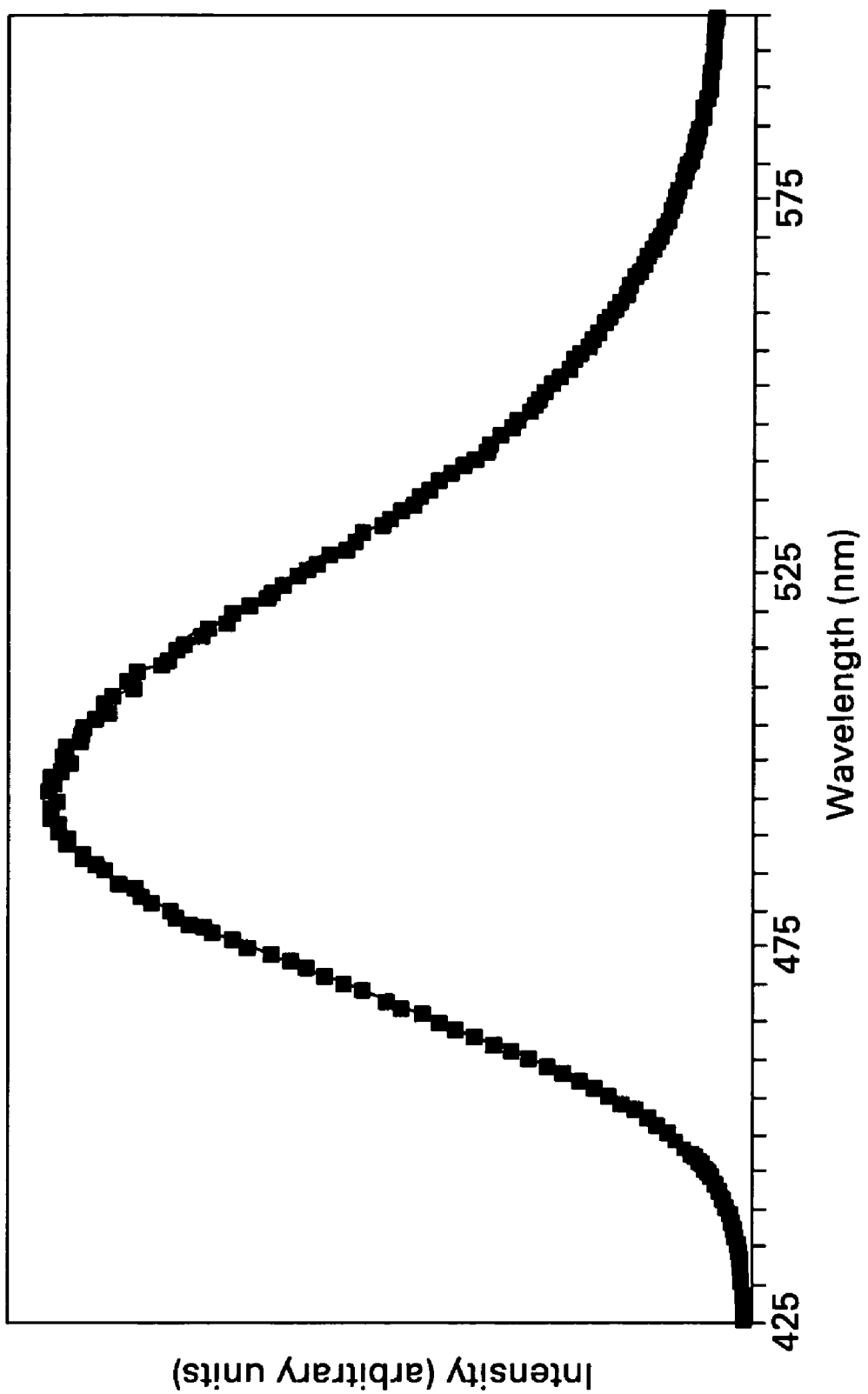
FIG. 9 shows the emission spectrum of the $Sr_{2.5}Ba_{0.6}Ca_{0.8}Eu_{0.1}Al_{14}O_{25}$ phosphor of the present invention.
Figure 10:
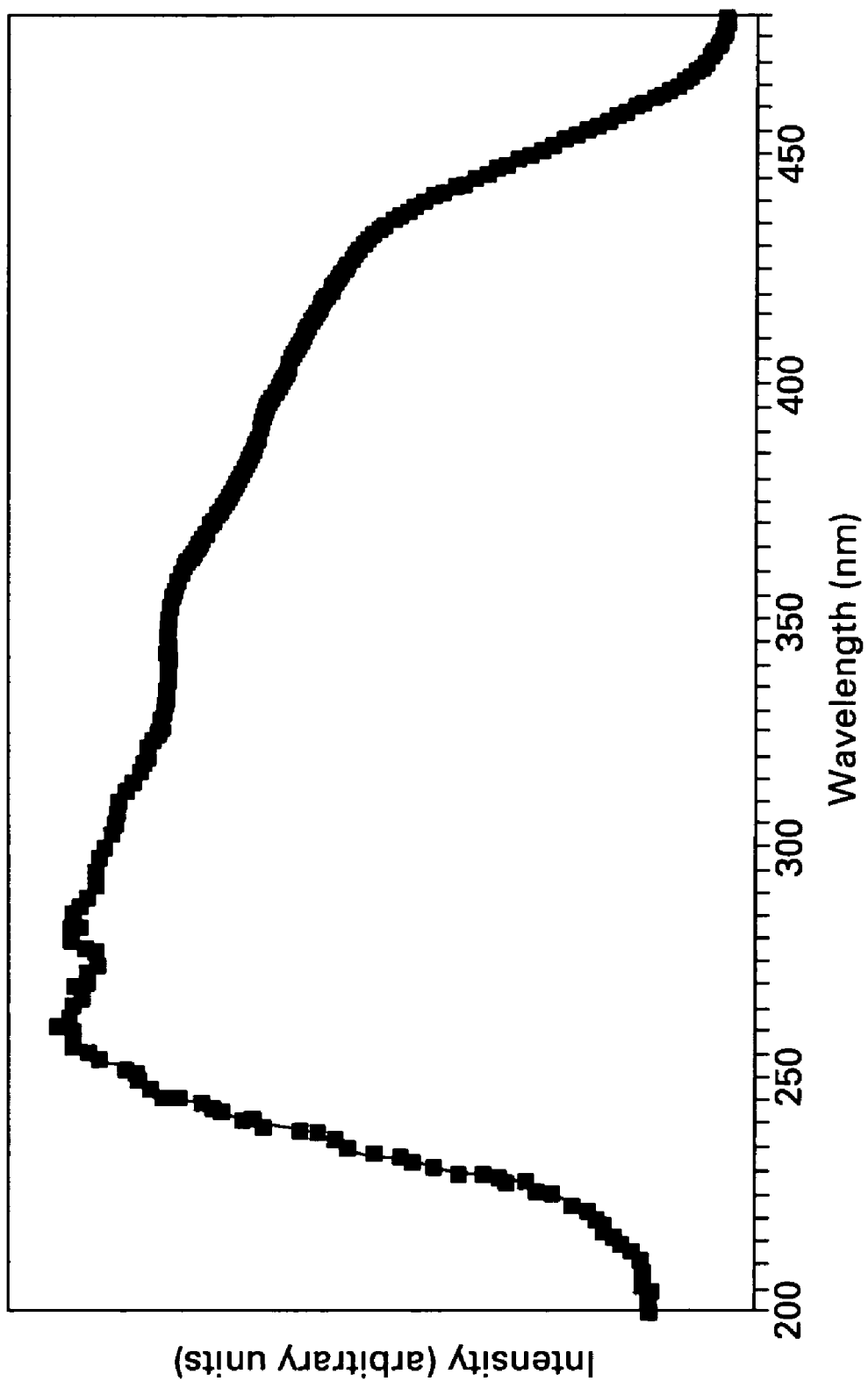
FIG. 10 shows the absorption spectrum of the $Sr_{3.4}Ca_{0.5}Eu_{0.1}Al_{12}O_{12}$ phosphor of the present invention.
Figure 11:
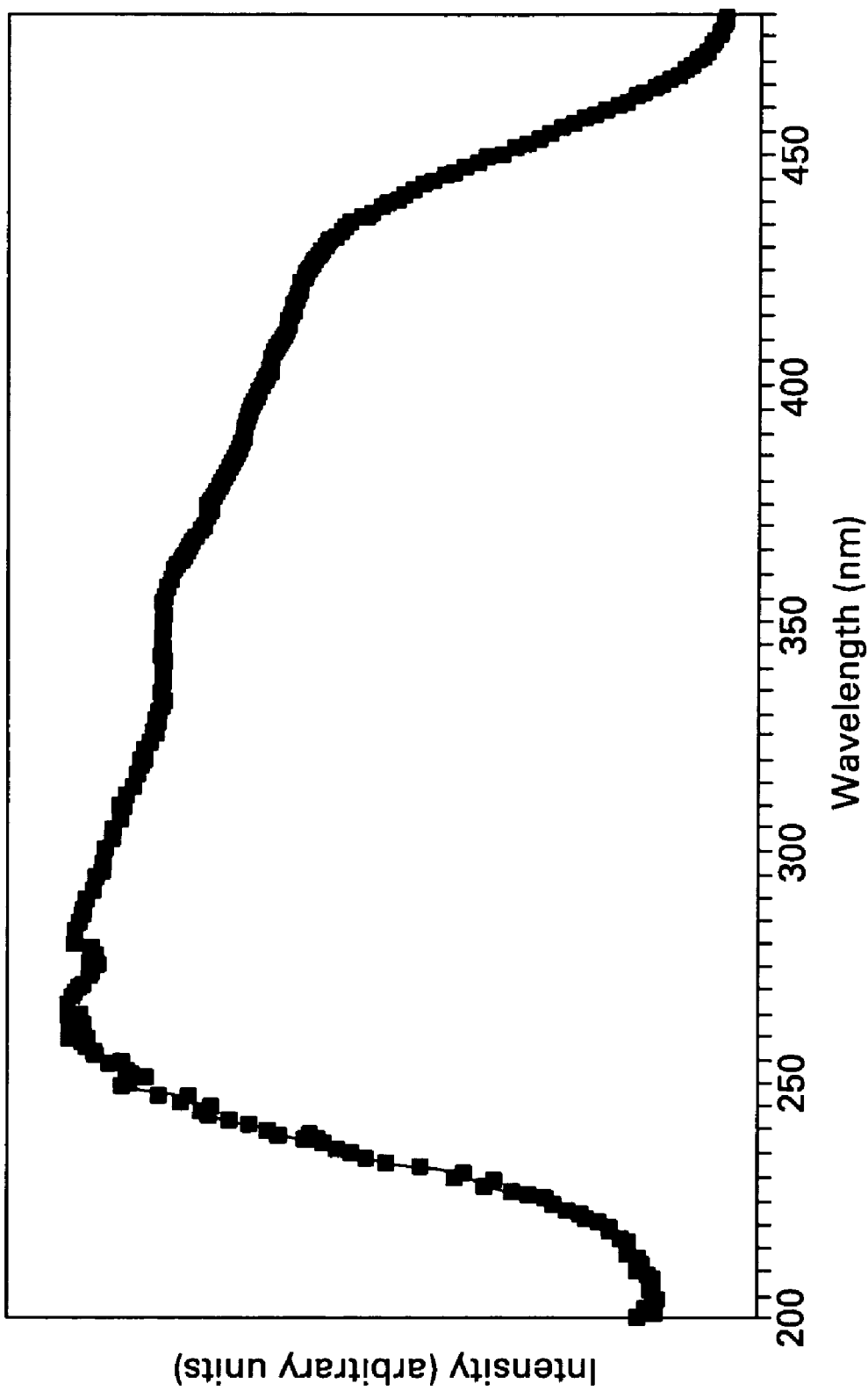
FIG. 11 shows the absorption spectrum of the $Sr_{3.3}Ca_{0.6}Eu_{0.1}Al_{12}O_{12}$ phosphor of the present invention.
Figure 12:
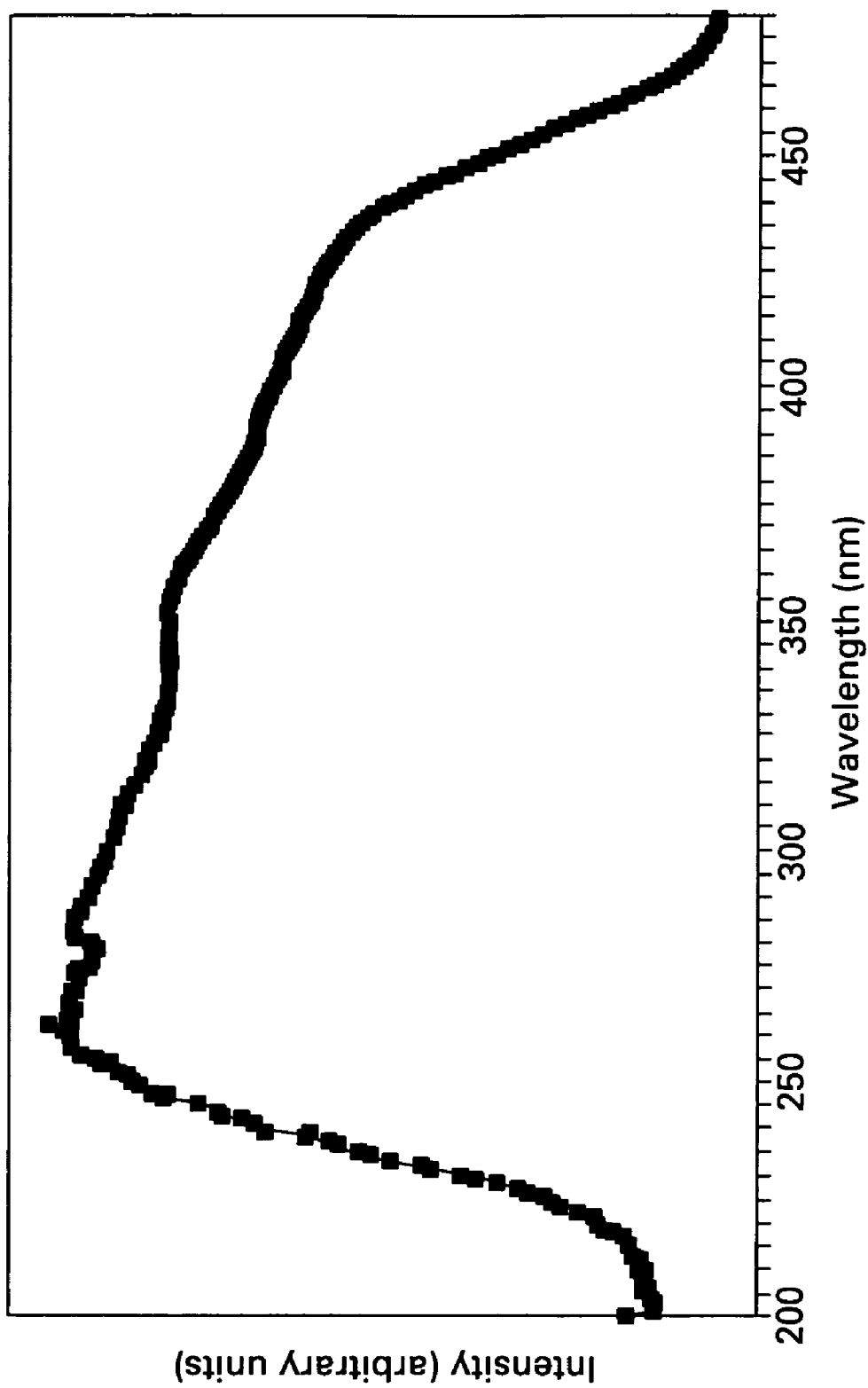
FIG. 12 shows the absorption spectrum of the $Sr_{3.1}Ba_{0.2}Ca_{0.6}Eu_{0.1}Al_{12}O_{12}$ phosphor of the present invention.
Figure 13:
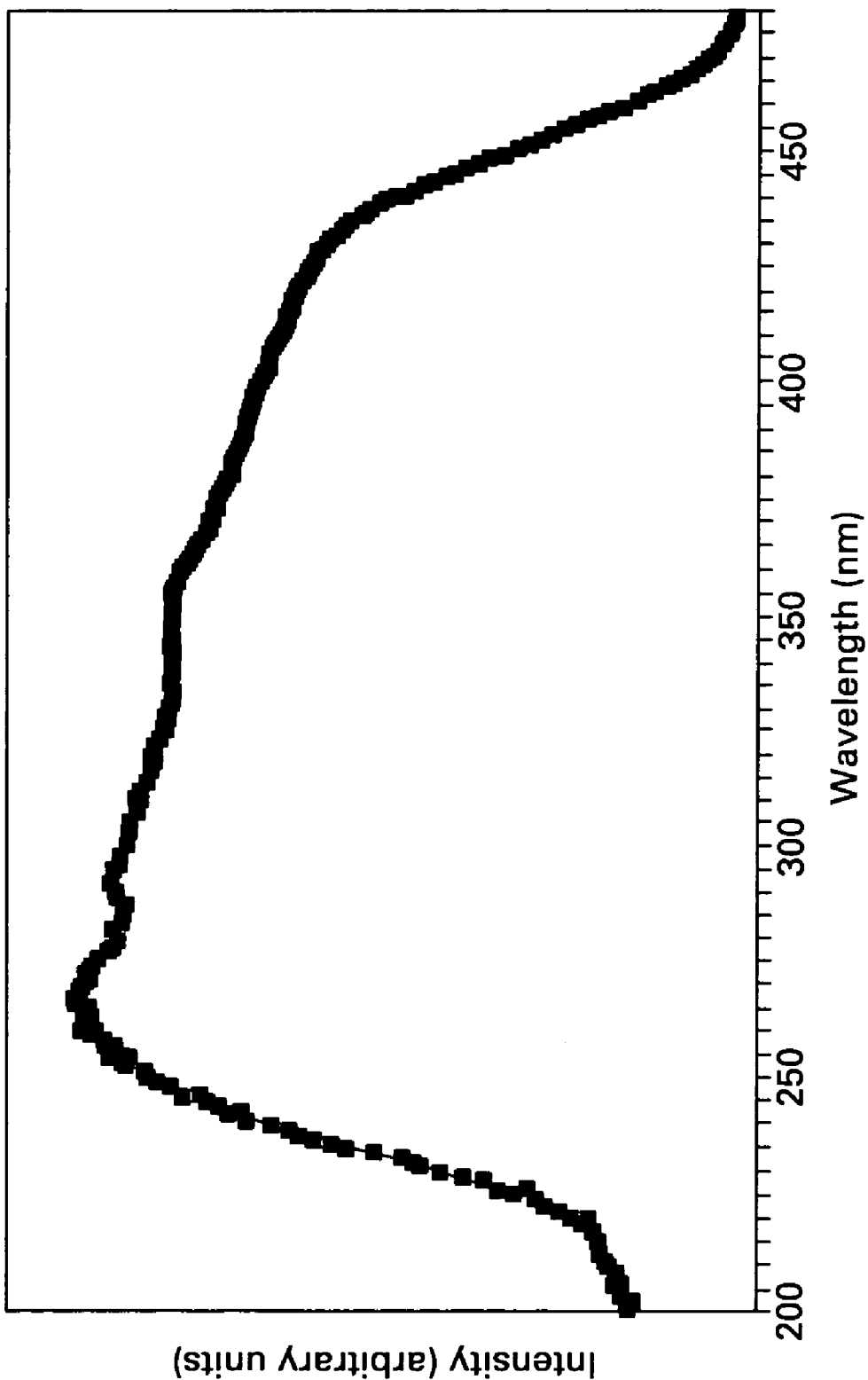
FIG. 13 shows the absorption spectrum of the $Sr_{2.5}Ba_{0.6}Ca_{0.8}Eu_{0.1}Al_{12}O_{12}$ phosphor of the present invention.
Figure 14:
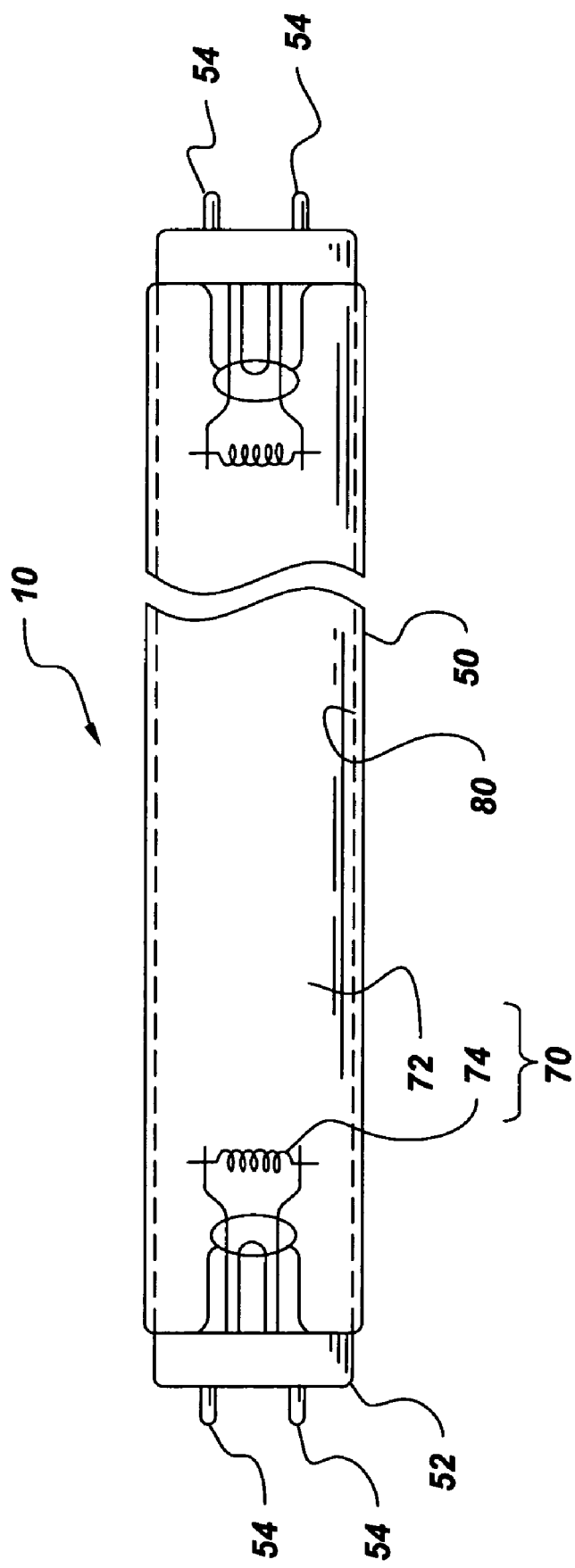
FIG. 14 shows schematically a light source that incorporates a phosphor of the present invention.
Figure 15:
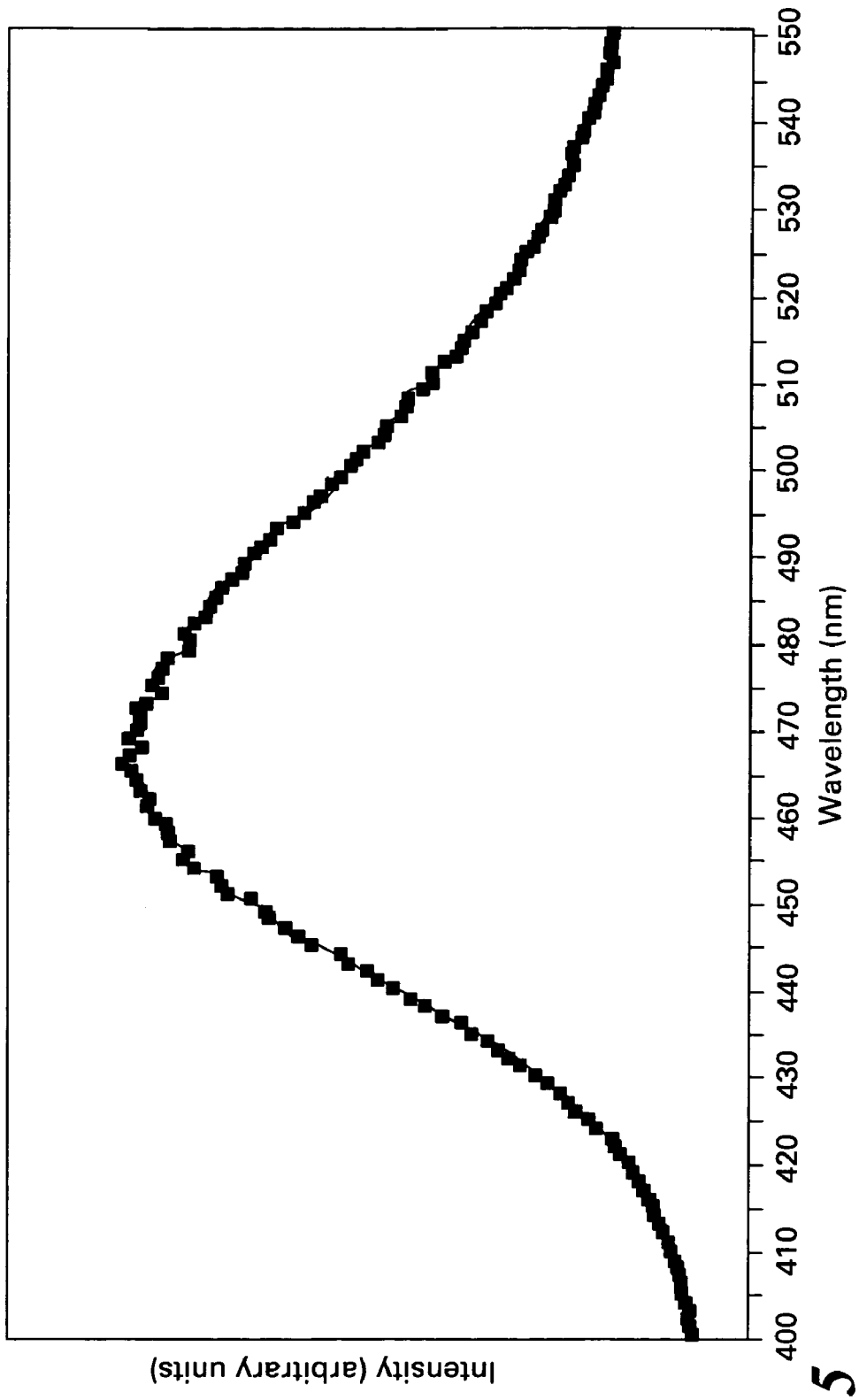
FIG. 15 shows the emission spectrum of the $Sr_{2.9}LaEu_{0.1}Al_{11}MgO_{22}$ phosphor of the present invention.
Figure 16:
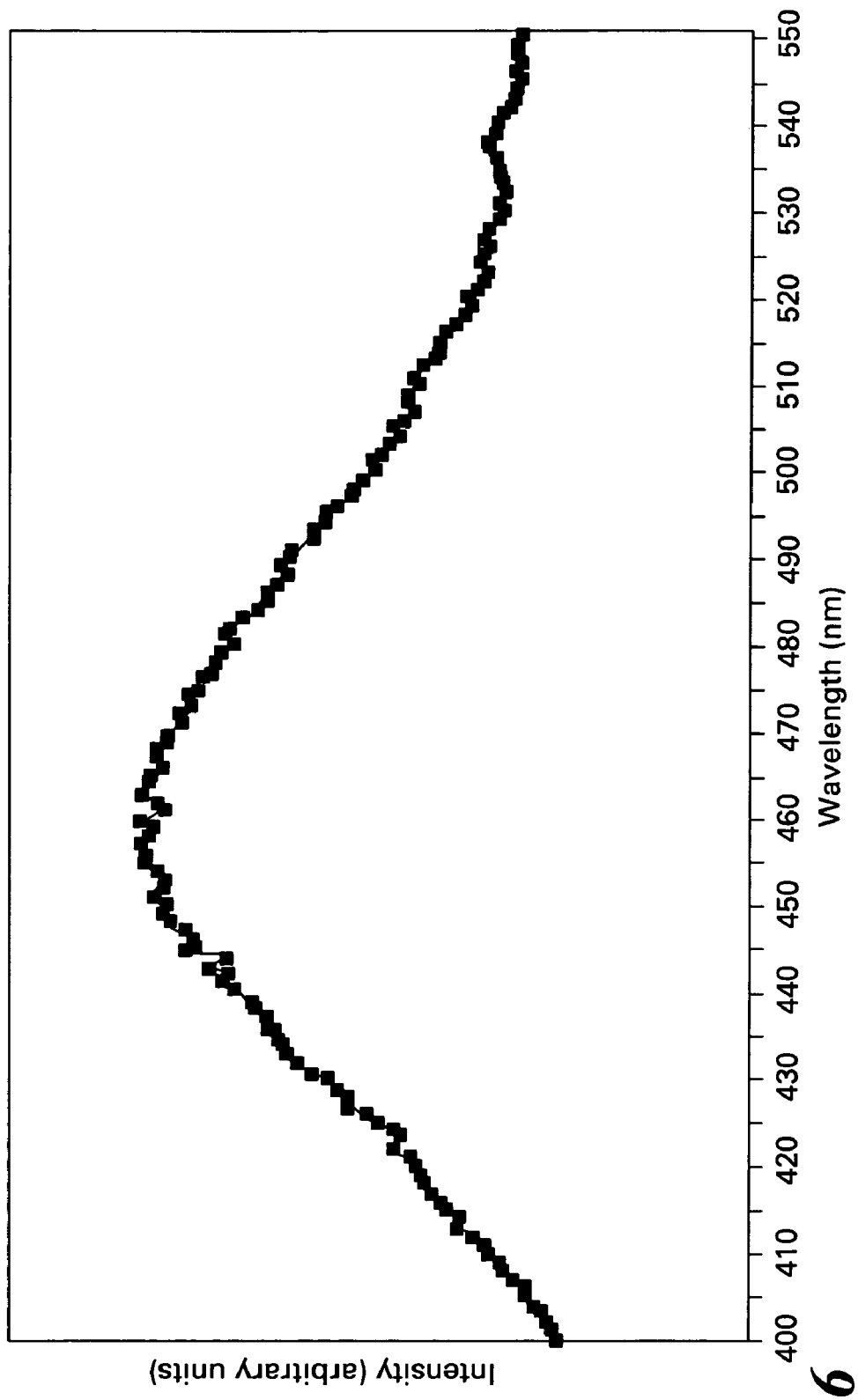
FIG. 16 shows the emission spectrum of the $Sr_{1.9}La_2Eu_{0.1}Al_{10}Mg_2O_{22}$ phosphor of the present invention.
Figure 17:
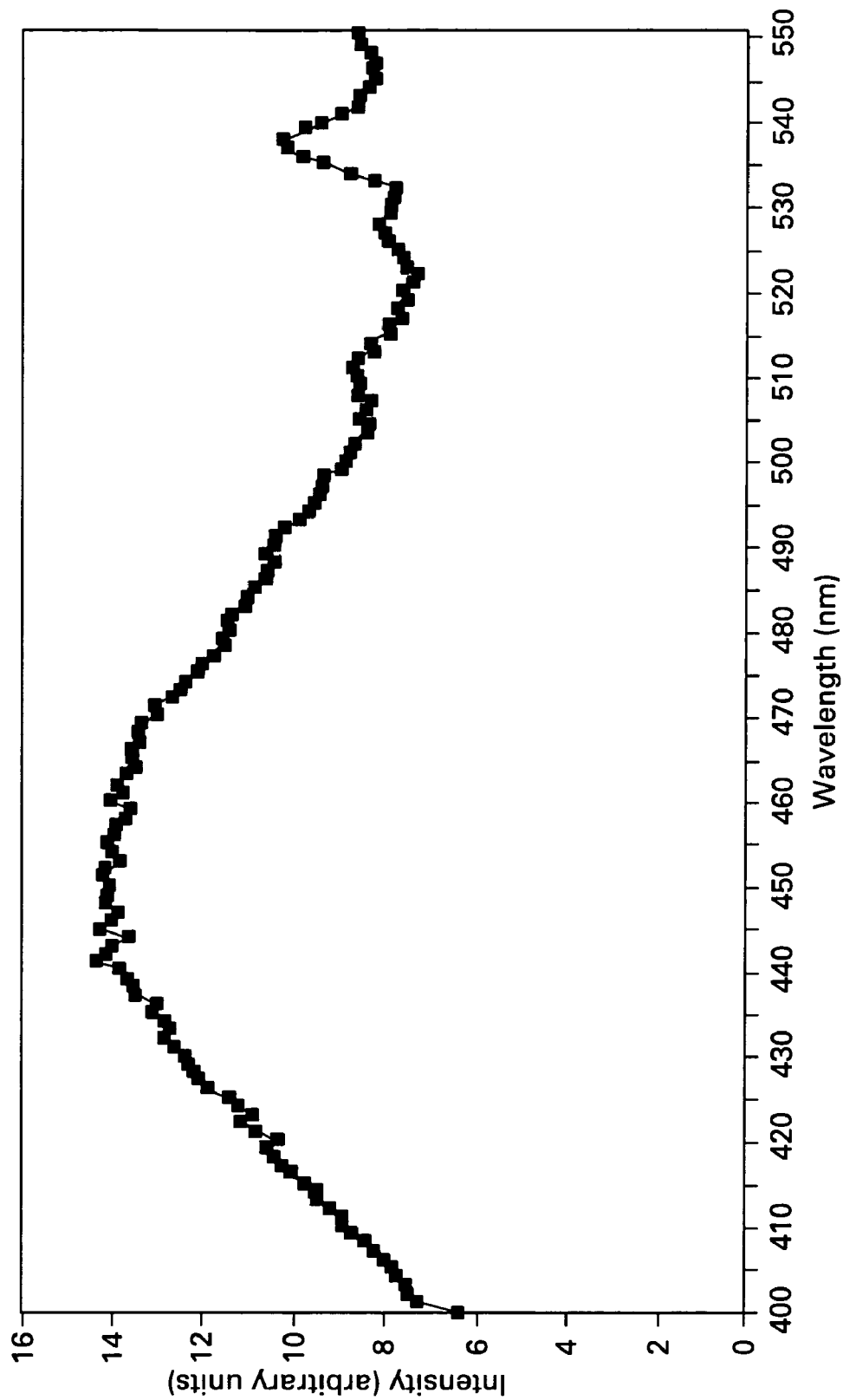
FIG. 17 shows the emission spectrum of the $Sr_{0.9}La_3Eu_{0.1}Al_9Mg_3O_{22}$ phosphor of the present invention.
Figure 18:
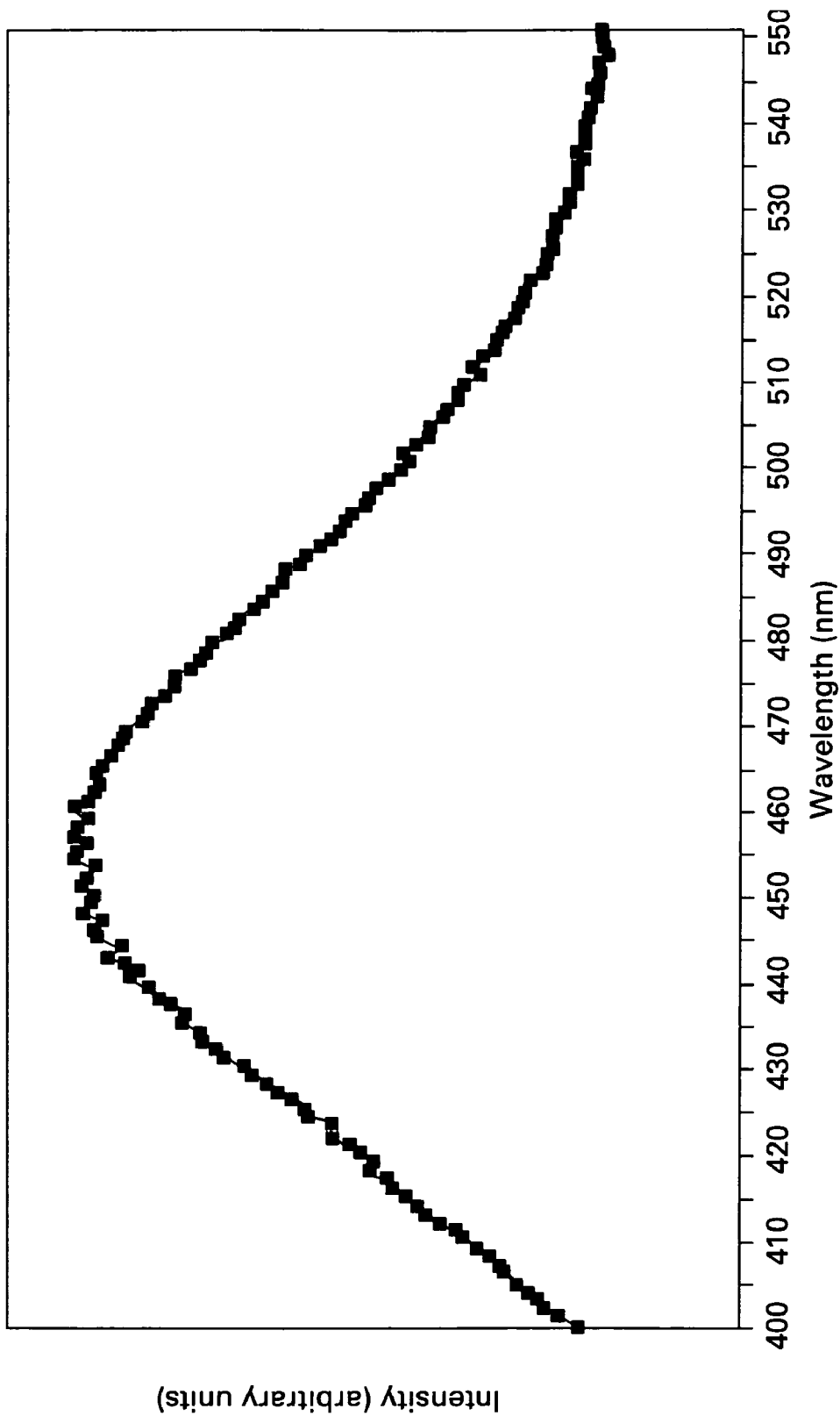
FIG. 18 shows the emission spectrum of the $Sr_{2.9}LaEu_{0.1}Al_{13}MgO_{25}$ phosphor of the present invention.
Figure 19:
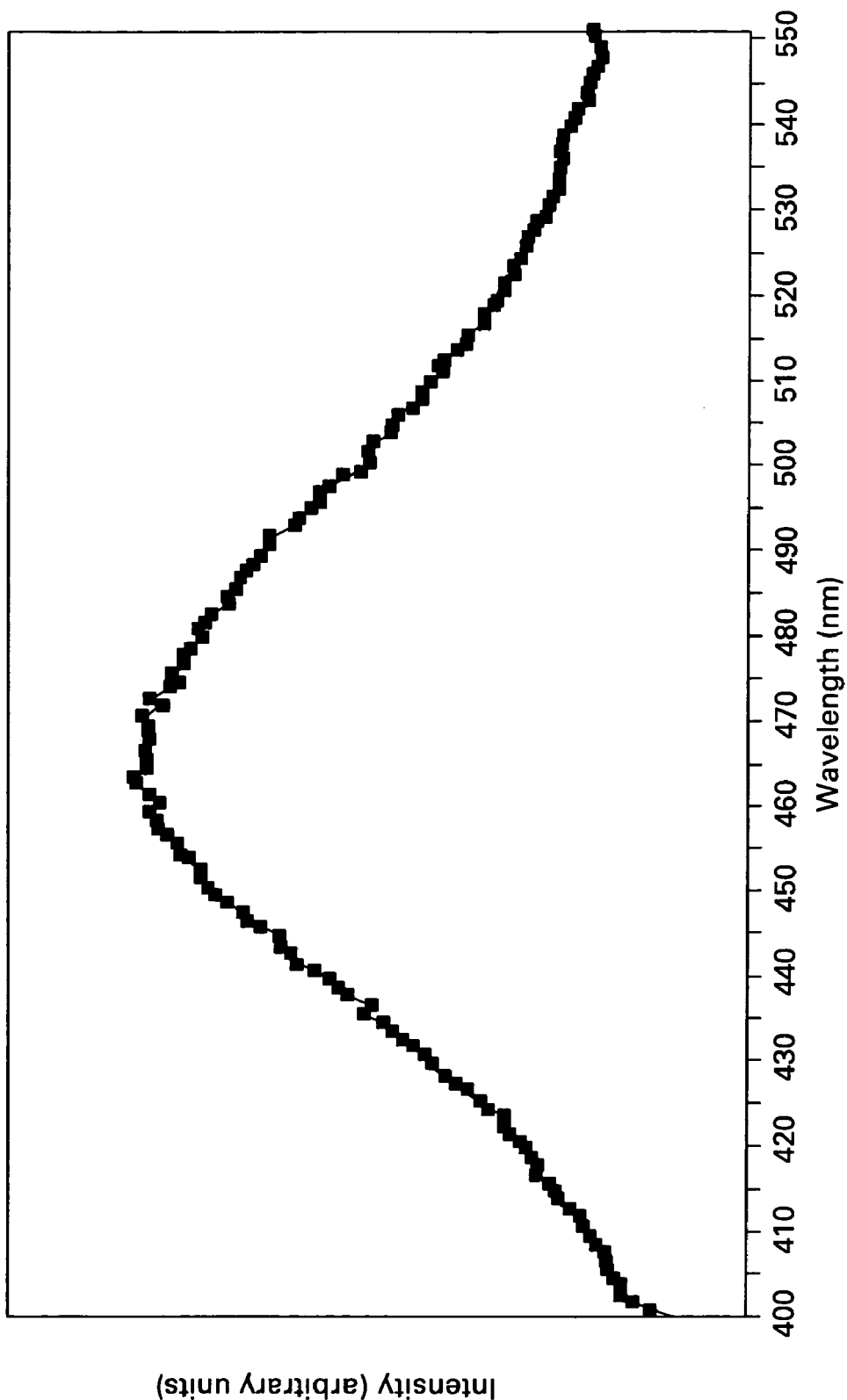
FIG. 19 shows the emission spectrum of the $Sr_{1.9}La_2Eu_{0.1}Al_{12}Mg_2O_{25}$ phosphor of the present invention.
Figure 20:
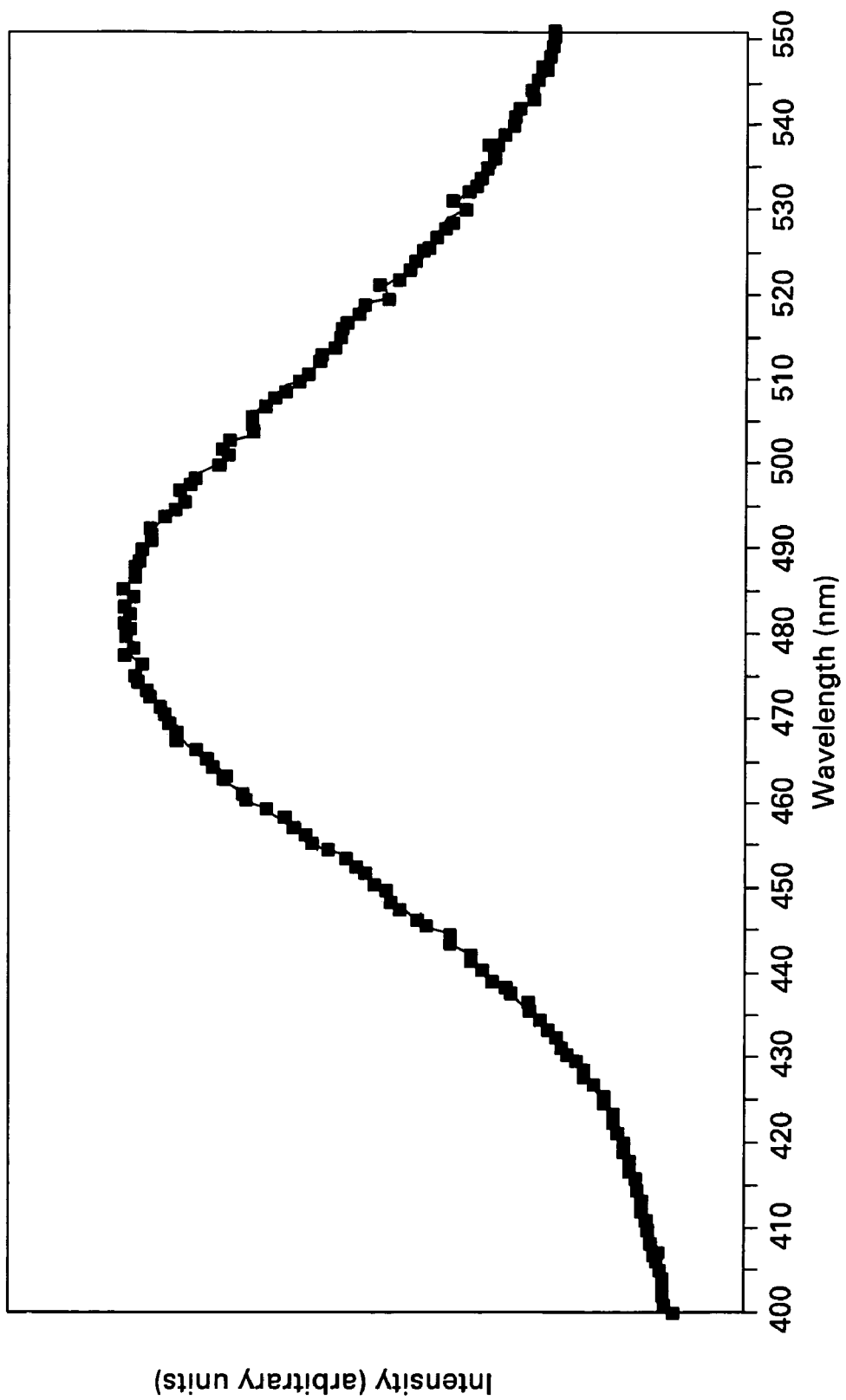
FIG. 20 shows the emission spectrum of the $Sr_{0.9}La_3Eu_{0.1}Al_{11}Mg_3O_{25}$ phosphor of the present invention.

In one embodiment of the present invention, a light source 10, which produces white light with a high CRI suitable for general illumination (e.g., CRI in the range from about 85 to about 100), especially for special illumination purposes that require high CRIs, is shown in FIG. 14. Light source 10 comprises an evacuated sealed housing 50, a means 70 for generating UV radiation, which means is located within housing 50, and a phosphor blend 80 located within housing 50 and adapted to be excited by UV radiation. In one embodiment, light source 10 is a fluorescent lamp and evacuated housing 50 comprises an evacuated glass tube and associated end caps 52. In another embodiment, the phosphor blend is disposed on an inner surface of housing 50. Means 70 for generating UV radiation is a combination of a gas comprising a means 74 for generating high-energy electrons and a means 72 for absorbing the energy of the high-energy electrons. In one embodiment, means 72 for absorbing energy of high-energy electrons is a gas comprising mercury vapor, which absorbs energy of the high-energy electrons to create a mercury vapor discharge to excite the phosphor. In addition to mercury vapor, the gas can comprise an inert gas such as argon, krypton, or xenon. Means 74 for generating high-energy electrons may be a filament of a metal having a low work function (such as less than 4.5 eV), such as tungsten, or such a filament coated with alkaline earth metal oxides as are known in the art. Pins 54 are provided to supply electrical power to electron-generating means 74. The filament is coupled to a high-voltage source to generate electrons from the surface thereof. A phosphor of the present invention may be used in combination with other conventional phosphors used in fluorescent lighting technology. For example, a phosphor of the present invention may be combined with conventional red, green, and blue light-emitting phosphors, which conventional phosphor are disclosed herein above, to produce white light from a mercury discharge lamp. A particulate material comprising $TiO_2$ and/or $Al_2O_3$ can be used in conjunction with the phosphor blend to scatter light generated by light source 10. Such a light scattering material can be blended into the phosphor blend or disposed as a layer between the inner surface of housing 50 and phosphor layer 80. Although light source 10 shown in FIG. 3 comprises a straight housing 50, it should be understood that other housing shapes also are applicable. For example, a compact fluorescent lamp can have a housing that has one or more bends, and electrical supply pins 54 are disposed at one end of light source 10.

Figure 21:
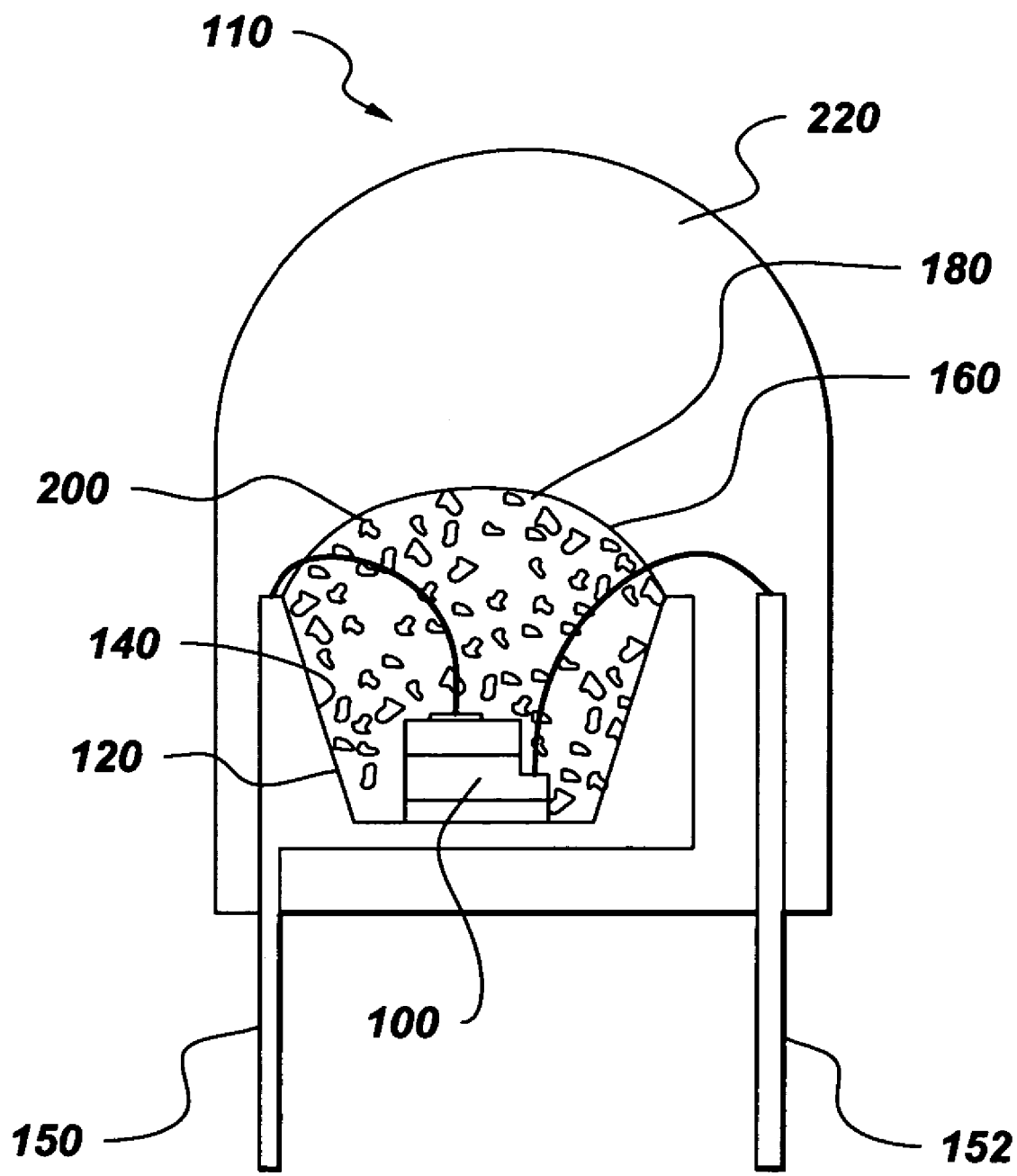
FIG. 21 shows schematically a light source using a phosphor of the present invention, wherein the source of radiation is a light-emitting diode.

In another embodiment, a blue-green light-emitting phosphor of the present invention also can be used to provide a visible light source based on a UV or UV-blue light emitting diode or laser diode (collectively referred to as "LED" for convenience). Such blue-green light-emitting phosphor may be used alone to provide a monochromatic light source or in a blend with other phosphors, such as blue and red light-emitting phosphors (or blue, red, and other green light-emitting phosphors), to provide a light source emitting white light. The white light source may be fabricated to provide a point source device by using one LED or a large-area lighting device by using a plurality of LEDs. For example, an LED-based light source 110 is shown in FIG. 21. Light source 110 comprises a LED 100 emitting UV or UV-blue light in the range of about 180 nm to about 480 nm and a phosphor of the present invention. The LED 100 is mounted in a cup 120 having a reflective surface 140 adjacent LED 100. Exemplary UV or UV-blue LEDs suitable as sources of radiation are those described in U.S. Pat. Nos. 5,777,350 and 6,210,987, which are incorporated herein by reference. Other UV-blue LEDs also may be used, such as LEDs based on GaN semiconductor doped with various metals to provide a large band gap. Electrical leads 150 and 152 are provided to supply electrical power to the LED 100. A transparent casting 160 comprising an epoxy, a silicone, or glass 180 in which there are dispersed substantially uniformly particles 200 of a phosphor of the present invention. Alternatively, the phosphor particles may be applied on the LED 100 or dispersed in only a portion of the transparent casting 160. Other transparent polymers also may be used to form the transparent casting. In addition, particles of a light scattering material, such as $TiO_2$ or $Al_2O_3$, may be included in the transparent casting among the phosphor particles to improve the uniformity of the light emitted from the light source 110. The transparent casting may be enclosed within a transparent housing 220. The composition of the InGaN active layer of the LED and the quantity of the phosphor applied in the casting may be chosen such that a portion of the blue light emitted by the LED that is not absorbed by the phosphor and the light emitted by the phosphor are combined to provide the white light source 110 of a desired color temperature and CRI.

Figure 22:
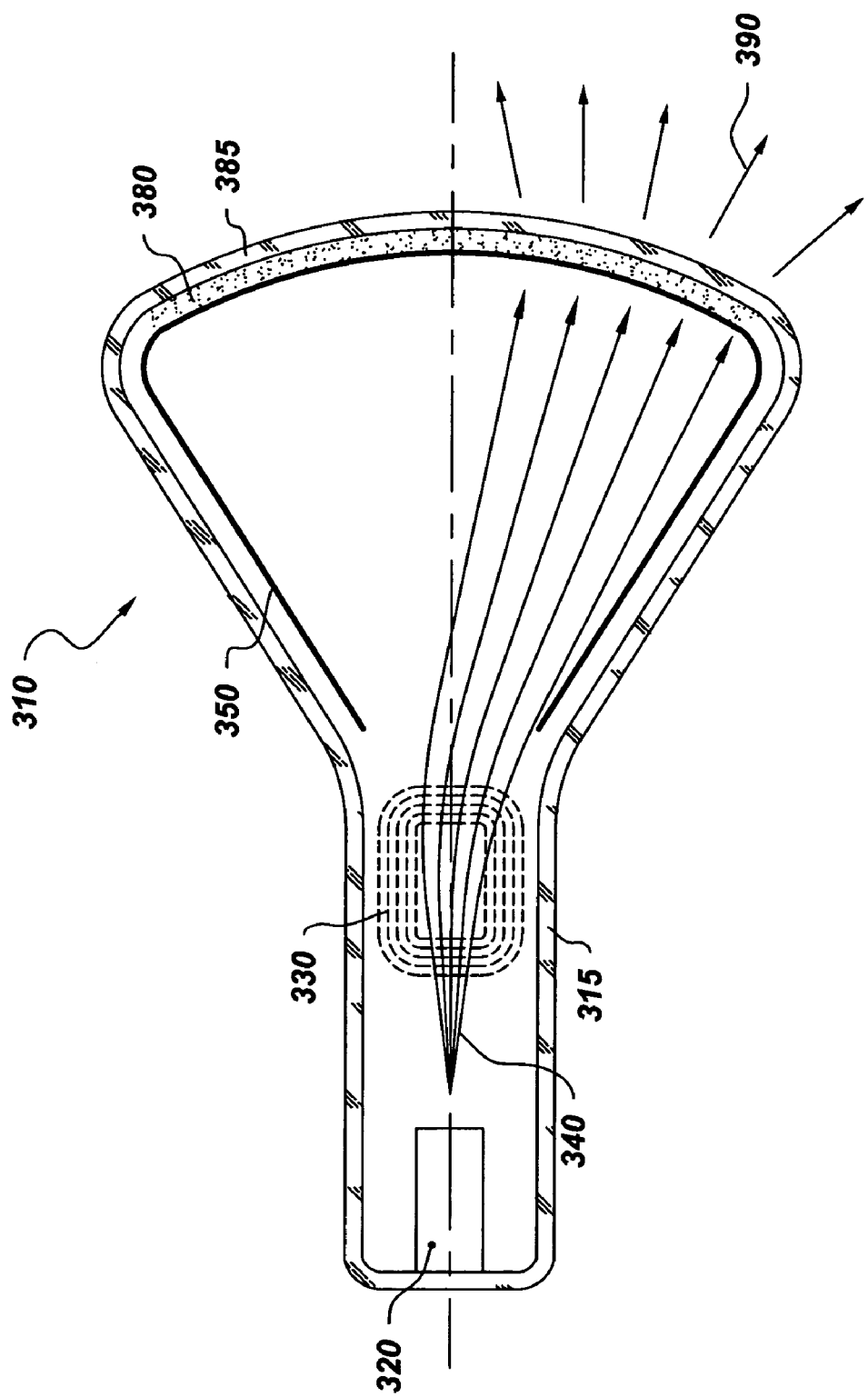
FIG. 22 shows schematically a display using a phosphor of the present invention, wherein the source of radiation is high-energy electrons.

A blue-green light-emitting phosphor of the present invention also can be used as a component of a phosphor blend for displays, such as cathode-ray tubes, which phosphor blend comprises blue, green, and red light-emitting phosphors. In this case, the high-energy electrons bombard a screen on which a coating of the phosphor blend is disposed to emit light in the visible spectral region. For example, FIG. 22 shows schematically a display 310 that uses a phosphor of the present invention, singly or in combination with other phosphors. Display 310 comprises a sealed housing 315, wherein an electron gun 320 is located. Electron gun 320 produces a beam 340 of high-energy electrons, which is deflected by an electro magnetic field produced by system 330. Deflected electrons accelerate toward anode 350 and impinge on a phosphor layer 380, which is disposed on an internal surface of display screen 385 to excite the phosphor in layer 380 to produce visible light 390. Phosphor layer 380 comprises at least a phosphor of the present invention. Preferably, phosphor layer 380 also comprises other phosphors emitting other primary colors to provide a color display.

While specific preferred embodiments of the present invention have been described in the foregoing, it will be appreciated by those skilled in the art that many modifications, substitutions, or variations may be made thereto without departing from the spirit and scope of the invention as defined in the appended claims.

What is claimed is:

1. A phosphor comprising an oxide; said phosphor having a formula selected from the group consisting of $Sr_{4-a-z}A_aEu_zD_{12}O_{22}$ and $Sr_{4-a-z}A_aEU_zD_{14}O_{25}$; wherein A includes at least two alkaline-earth metals other than strontium; D is at least an element selected from the group consisting of Group-13 metals, Group-3 metals, and rare-earth metals other than europium; $0<a<4$; $0.001<z<0.3$; and $4-a-z>0$.

2. The phosphor according to claim 1, wherein A is selected from the group consisting of calcium, barium, magnesium, and combinations thereof.

3. The phosphor according to claim 1, wherein A is selected from the group consisting of calcium, barium, and combinations thereof.

4. The phosphor according to claim 1, wherein D is aluminum.

5. A phosphor comprising a material having a formula selected from the group consisting of $Sr_{4-x-y-z}Ba_xCa_yEu_zD_{12}O_{22}$ and $Sr_{4-x-y-z}Ba_xCa_yEu_zD_{14}O_{25}$; wherein D is at least a Group-13 metal; $0<x$, $y=2$ and x and y are non-zero; $0.001<z<0.3$; and $4-x-y-z>0$.

6. The phosphor according to claim 5, wherein x and y satisfy a condition: $0<x=1.5$ and $0<y=1.5$.

7. The phosphor according to claim 5, wherein x and y satisfy a condition: $0<x=1$ and $0<y=1$.

8. The phosphor according to claim 5, wherein $0<z=0.2$.

9. A phosphor comprising a material having a formula selected from the group consisting of $Sr_{3.1}Ba_{0.2}Ca_{0.6}Eu_{0.1}Al_{12}O_{22}$, $Sr_{2.7}Ba_{0.2}CaEu_{0.1}Al_{12}O_{22}$, $Sr_{2.5}Ba_{0.6}Ca_{0.8}Eu_{0.1}Al_{12}O_{22}$, $Sr_{1.9}BaCaEu_{0.1}Al_{12}O_{22}$, $Sr_{3.1}Ba_{0.2}Ca_{0.6}Eu_{0.1}Al_{14}O_{25}$, $Sr_{2.7}Ba_{0.2}CaEu_{0.1}Al_{14}O_{25}$, $Sr_{2.5}Ba_{0.6}Ca_{0.8}Eu_{0.1}Al_{14}O_{25}$, and $Sr_{1.9}BaCaEu_{0.1}Al_{14}O_{25}$.

10. A phosphor comprising a material having a formula selected from the group consisting of $Sr_{4-a-z}A_aEu_zD_{12}O_{22}$ or $Sr_{4-a-z}A_aEu_zD_{14}O_{25}$; wherein A is at least an alkaline-earth metal other than strontium; D is a combination of a Group-3 metal and at least a Group-13 metal; $0<a<4$; $0.001<z<0.3$; and $4-a-z>0$.

11. The phosphor according to claim 10, said phosphor having a formula selected from the group consisting of $Sr_{2.9}MgEu_{0.1}Al_{11}LaO_{22}$, $Sr_{1.9}Mg_2Eu_{0.1}Al_{10}La_2O_{22}$, $Sr_{0.9}Mg_3Eu_{0.1}Al_9La_3O_{22}$, $Sr_{2.9}MgEu_{0.1}Al_{13}LaO_{25}$, $Sr_{1.9}Mg_2Eu_{0.1}Al_{12}La_2O_{25}$, and $Sr_{0.9}Mg_3Eu_{0.1}Al_{11}La_3O_{25}$.

12. A phosphor blend comprising: (a) a phosphor having a formula selected from the group consisting of $Sr_{4-a-z}A_aEu_zD_{12}O_{22}$ and $Sr_{4-a-z}A_aEu_zD_{14}O_{25}$ wherein A includes at least two alkaline-earth metals other than strontium; D is at least an element selected from the group consisting of Group-13 metals, Group-3 metals, and rare-earth metals other than europium; $0<a<4$; $0.001<z<0.3$; and $4-a-z>0$; and (b) a red light-emitting phosphor.

13. The phosphor blend according to claim 12, further comprising a blue light-emitting phosphor.

14. The phosphor blend according to claim 13, further comprising a green light-emitting phosphor.

15. A method for making a phosphor, the method comprising:
(a) mixing oxygen-containing compounds of: (1) europium; (2) at least three alkaline-earth metals; (3) at least a Group-13 metal, and (4) at least a material selected from the group consisting of lithium tetraborate, lithium carbonate, hydrogen borate, alkali hydroborate, and combinations thereof to form a mixture; and
(b) firing the mixture in a reducing atmosphere at a temperature in a range from about 1000° C. to about 1400° C. for a time sufficient to convert the mixture to the phosphor.

16. The method according to claim 15; wherein one of said at least three rare-earth metals is strontium.

17. The method according to claim 15, wherein said at least a Group-13 metal is aluminum.

18. The method according to claim 15, wherein the mixture further comprises at least a halide compound of an element selected from the group consisting of europium, said rare-earth metals, said Group-13 metal, and combinations thereof.

19. A light source comprising:
(a) a source of radiation; and
(b) a phosphor disposed adjacent to the source of radiation and adapted to be excited by radiation emitted by the source of radiation and to emit visible light; wherein the phosphor comprises a material having a formula of selected from the group consisting of $Sr_{4-a-z}A_aEu_zD_{12}O_{22}$ and $Sr_{4-a-z}A_aEu_zD_{14}O_{25}$; A includes at least two alkaline-earth metals other than strontium; D is an element selected from the group consisting of Group-13 metals, Group-3 metals, and rare-earth metals other than europium; $0<a<4$; $0.001<z<0.3$; and $4-a-z>0$.

20. The light source according to claim 19; wherein A is a combination of barium and calcium; said formula is selected from the group consisting of $Sr_{4-x-y-z}Ba_xCa_yEu_zD_{12}O_{22}$ and $Sr_{4-x-y-z}Ba_xCa_yEu_zD_{14}O_{25}$; $0<x$, $y=2$ and x and y are non-zero; $0.001<z<0.3$; and $4-x-y-z>0$.

21. The light source according to claim 20, wherein D is aluminum.

22. The light source according to claim 20, wherein said formula is selected from the group consisting of $Sr_{3.1}Ba_{0.2}Ca_{0.6}Eu_{0.1}Al_{12}O_{22}$, $Sr_{2.7}Ba_{0.2}CaEu_{0.1}Al_{12}O_{22}$, $Sr_{2.5}Ba_{0.6}Ca_{0.8}Eu_{0.1}Al_{12}O_{22}$, $Sr_{1.9}BaCaEu_{0.1}Al_{12}O_{22}$, $Sr_{3.1}Ba_{0.2}Ca_{0.6}Eu_{0.1}Al_{14}O_{25}$, $Sr_{2.7}Ba_{0.2}CaEu_{0.1}Al_{14}O_{25}$, $Sr_{2.5}Ba_{0.6}Ca_{0.8}Eu_{0.1}Al_{14}O_{25}$, and $Sr_{1.9}BaCaEu_{0.1}Al_{14}O_{25}$.

23. The light source according to claim 19, wherein said formula is selected from the group consisting of $Sr_{2.9}MgEu0.1Al_{11}LaO_{22}$, $Sr_{1.9}Mg_2Eu_{0.1}Al_{10}La_2O_{22}$, $Sr_{0.9}Mg_3Eu_{0.1}Al_9La_3O_{22}$, $Sr_{2.9}MgEu_{0.1}Al_{13}LaO_{25}$, $Sr_{1.9}Mg_2Eu_{0.1}Al_{12}La_2O_{25}$, and $Sr_{0.9}Mg_3Eu_{0.1}Al_{11}La_3O_{25}$.

24. The light source according to claim 19, wherein the source of radiation is a mercury gas discharge.

25. The light source according to claim 19, wherein the source of radiation is a light-emitting diode.

26. A display comprising:
(a) a source of radiation that is located in a sealed housing, said radiation comprising high-energy electrons; and
(b) a phosphor disposed within the sealed housing and adapted to be excited by the radiation and to emit visible light; wherein the phosphor comprises a material having a formula of selected from the group consisting of $Sr_{4-a-z}A_aEu_zD_{12}O_{22}$ and $Sr_{4-a-z}A_aEu_zD_{14}O_{25}$; A includes at least two alkaline-earth metals other than strontium; D is an element selected from the group consisting of Group-13 metals, group-3 metals, and rare-earth metals other than europium; $0<a<4$; $0.001<z<0.3$; and $4-a-z>0$.

* * * * *